United States Patent
Fay et al.

(10) Patent No.: US 11,444,067 B2
(45) Date of Patent: Sep. 13, 2022

(54) STACKED INTERPOSER STRUCTURES, MICROELECTRONIC DEVICE ASSEMBLIES INCLUDING SAME, AND METHODS OF FABRICATION, AND RELATED ELECTRONIC SYSTEMS

(71) Applicant: Micron Technology, Inc., Boise, ID (US)

(72) Inventors: Owen R. Fay, Meridian, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 16/715,242

(22) Filed: Dec. 16, 2019

(65) Prior Publication Data

US 2021/0183842 A1 Jun. 17, 2021

(51) Int. Cl.
  H01L 29/40 (2006.01)
  H01L 25/18 (2006.01)
  H01L 25/16 (2006.01)
  H01L 23/48 (2006.01)
  H01L 23/00 (2006.01)
  H01L 25/00 (2006.01)

(52) U.S. Cl.
  CPC ............ *H01L 25/18* (2013.01); *H01L 23/481* (2013.01); *H01L 24/05* (2013.01); *H01L 24/16* (2013.01); *H01L 25/16* (2013.01); *H01L 25/50* (2013.01); *H01L 2224/02372* (2013.01); *H01L 2224/16146* (2013.01)

(58) Field of Classification Search
  None
  See application file for complete search history.

(56) References Cited

U.S. PATENT DOCUMENTS

| | | | |
|---|---|---|---|
| 2009/0311828 A1* | 12/2009 | Andry | H01L 23/49833 438/107 |
| 2015/0214191 A1* | 7/2015 | Lee | H01L 21/563 257/712 |
| 2021/0175162 A1* | 6/2021 | Yazdani | H01L 23/3107 |

OTHER PUBLICATIONS

Chip Scale Review, The Future of Semiconductor Packaging, vol. 23, No. 4, (Jul.-Aug. 2019) ChipScaleReview.com, 52 pages.
Fay et al., U.S. Appl. No. 62/772,291 titled Interposers for Microelectronic Devices, filed Nov. 28, 2018, 52 pages.
Rowland, John, 2.5D/3D IC Packaging Technologies—Design and Analysis Challenges, SVP, Uniscoc Spreadtrum & RDA Technologies, (Oct. 17, 2018), 25 pages.
Wikipedia, High Bandwidth Memory, https://en.wikipedia.org/wiki/High_Bandwidth_Memory, visited Aug. 19, 2019, 6 pages.

* cited by examiner

*Primary Examiner* — Hung K Vu
(74) *Attorney, Agent, or Firm* — TraskBritt

(57) ABSTRACT

An interposer comprises a semiconductor material and includes cache memory under a location on the interposer for a host device. Memory interface circuitry may also be located under one or more locations on the interposer for memory devices. Microelectronic device assemblies incorporating such an interposer and comprising a host device and multiple memory devices are also disclosed, as are methods of fabricating such microelectronic device assemblies.

18 Claims, 14 Drawing Sheets

STACKED INTERPOSER STRUCTURES, MICROELECTRONIC DEVICE ASSEMBLIES INCLUDING SAME, AND METHODS OF FABRICATION, AND RELATED ELECTRONIC SYSTEMS

TECHNICAL FIELD

Embodiments disclosed herein relate to stacked interposer structures and to microelectronic device assemblies including such stacked interposer structures, as well as to methods of fabrication of such structures and assemblies. More particularly, embodiments disclosed herein relate to assemblies comprising stacked interposer structures, each interposer comprising a semiconductor material and incorporating interface functions for mutual high bandwidth communication between microelectronic devices operably coupled to the stacked interposer structure, to assemblies of such microelectronic devices incorporating stacked interposer structures, to methods of fabrication of such structures and assemblies and to related electronic systems.

BACKGROUND

Many forms of microelectronic devices such as IC (integrated circuit) assemblies include multiple semiconductor die (also referred to herein as "die") or assemblies of such die physically and electrically connected to one another through an interposer. In some cases, such assembly on the interposer may be termed a "Multi-Chip Package" or "MCP." In some embodiments, the interposer may include a redistribution structure (sometimes termed in the art a "redistribution layer" or "RDL," as discussed further below) configured to establish interconnections between two or more of the multiple die within the assembly, and also to facilitate electrical and mechanical attachment to other devices (for example, a printed circuit board, such as a motherboard, or other higher-level packaging).

Such an RDL may include one or more dielectric layers, each dielectric layer supporting a level of conductive material defining conductive traces and vias extending through the respective dielectric layer to connect, directly or indirectly, with respective contacts on one or more semiconductor die and/or with vias in other layers of the RDL, to redistribute the die contacts to other locations on or within the interposer.

Interposers may be constructed with a core structure including either a non-organic material, such as a semiconductor material, such as silicon (generally termed a "silicon interposer"), or any one (or more) organic materials (generally termed an "organic interposer"). The term "semiconductor interposer" is used herein to identify an interposer comprising, (e.g., having a core formed of) a semiconductor material, which may be either an elemental material (such as e.g., silicon, germanium selenium, etc., as known to persons skilled in the art), or a compound semiconductor material (such as, e.g., gallium arsenide, indium gallium arsenide, also as known to persons skilled in the art). The term "non-organic interposer" is used to identify a core formed of a non-organic material which may be, for example, a semiconductor material, a glass material and/or a ceramic material. For purposes of providing examples herein, the embodiments of disclosed semiconductor interposers will be described in the form of silicon interposers.

Under conventional processing, organic interposers tend to be more resilient, and therefore more resistant to cracking or other damage resulting from physical or thermal stresses. That resistance to physical or thermal stresses is somewhat offset, however, by organic interposers typically having a significantly different coefficient of thermal expansion ("CTE") from the CTE of the semiconductor die or die assemblies attached to the interposer, thus being susceptible to generating physical stress at the die attachment. In addition, commercially viable technology for forming organic interposers experiences difficulty in providing line spacings of less than about 10/10 μLS. This current practical limitation leaves a significant dimensional gap relative to feature spacing achievable in conventional silicon processing employed in fabricating state of the art semiconductor die. As a result, current commercially viable processes for forming organic interposers cannot match the minimum contact spacing of semiconductor die that would desirably be attached to the interposer, imposing an undesirable restriction in terms of real estate required for microelectronic device assemblies and requiring undesirably long signal paths.

Further, interposer performance characteristics are becoming of increasing importance for implementation of some high bandwidth applications. One example of a microelectronic assembly disclosed herein includes high bandwidth communications between one or more high bandwidth memory (HBM) devices and a processor. While each memory device may be an individual semiconductor die, it is becoming increasingly common for each memory device to comprise a vertical stack of multiple (e.g., four, eight, twelve, sixteen, etc.) memory die interconnected by through silicon vias (TSVs) and inter-die conductive elements, such as copper pillars, operably coupled to the TSVs. In some instances, the stack further includes an operably coupled logic die, which may also be characterized as a controller or interface die. In order to obtain full performance benefit of such multi-die memory devices, an associated processor must be able to access multiple portions of the interconnected memory die in parallel through high-speed parallel communication channels for data, command, and control signals between the processor and the multi-die memory device.

To meet design criteria for such high-speed parallel communications, including without limitation minimization of conductive trace resistance and inter-trace capacitance, interposers are projected to require tighter line spacing ("L/S"), of less than 5/5 μLS, and preferably on the order of 2/2 μLS or smaller. Semiconductor interposers, for example silicon interposers, may be configured to provide such US capability since they may be fabricated employing conventional semiconductor die fabrication methods.

While use of semiconductor material-based interposers addresses the above issues, it is conventional as noted above, in implementation of HBM devices to employ a discrete interface die between the stack of memory die of each HBM device and an interposer. Such an approach increases fabrication and assembly costs, lengthens signal paths, and increases height of the HBM device assembly.

In addition to the abovementioned considerations for desirability of implementing interposers using semiconductor (e.g., silicon) materials, utilization of semiconductor materials may also facilitate reduction in cost and size of certain processor categories, for example graphic processing units (GPUs). It has been proposed that GPU designs monolithically integrate cache memory in the form of static random access memory (SRAM). Unfortunately, such an approach would suffer from a requirement of incorporating TSVs in the GPU, but fabrication of the SRAM cache memory requires a significantly different process sequence than is employed in GPU fabrication. In addition, SRAM may consume an undesirable amount of real estate in the GPU due to its memory component structure. Other processors such as central processing units (CPUs), controllers and so-called System on a Chip (SoC) as well as other host devices may also suffer from a somewhat awkward integration of cache memory circuitry with processor circuitry fabrication techniques.

Embodiments of the disclosure encompass stacked interposer structures, the interposers of which may be cooperatively configured for, in combination, effectively providing such high bandwidth communication while reducing fabrication and assembly costs and reducing component and assembly size. Microelectronic device assemblies incorporating such stacked interposer structures and methods for fabricating such assemblies may offer advantages in terms of cost reduction, higher yield and enhanced performance.

DETAILED DESCRIPTION

Figure 1A:
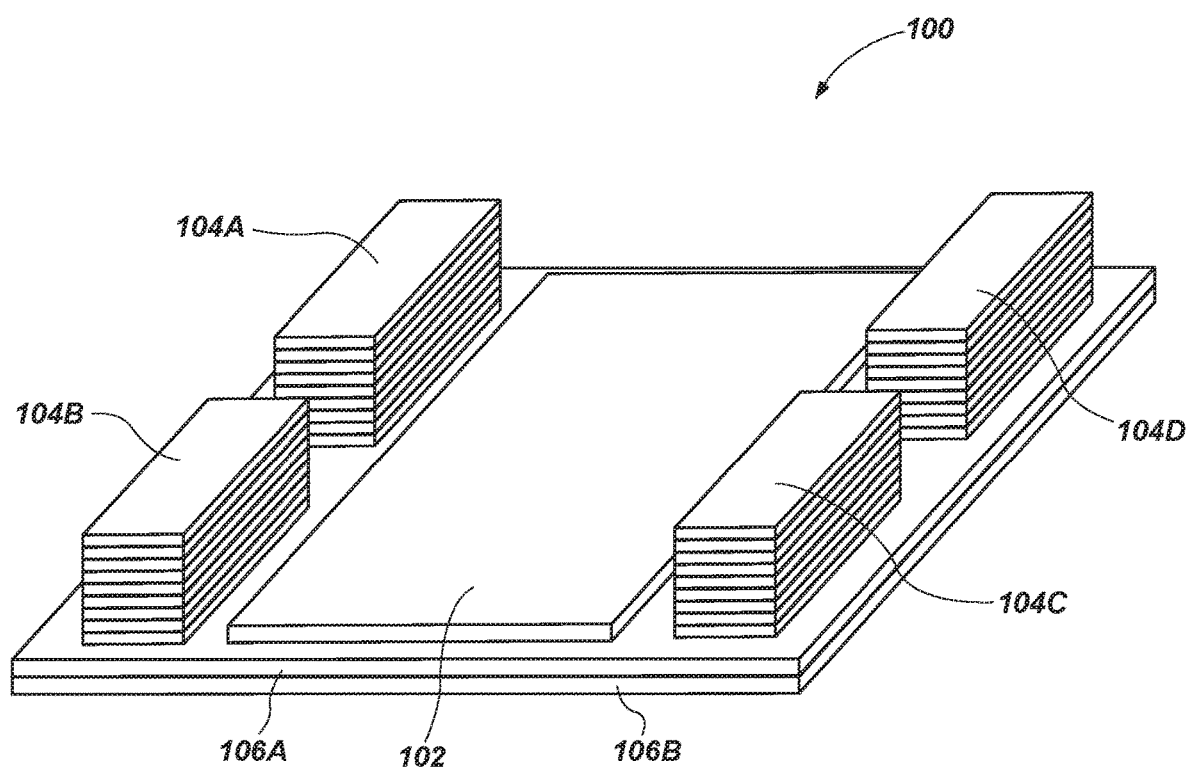
FIG. 1A is a schematic perspective view of a microelectronic assembly including a host device in the form of a processor, and multiple memory devices mounted to a stacked interposer structure according to an embodiment of the disclosure.

One example of a proposed microelectronic device assembly to address the issues mentioned above, would comprise a host device, for example a GPU, and a memory device comprising multiple stacked memory die, for example high bandwidth memory devices, all mounted to an interposer comprising a semiconductor material (e.g., silicon), which may be characterized as a "core." The interposer would be, in turn, mounted and operably coupled to a laminate (e.g., organic) substrate for connecting the microelectronic device assembly to higher-level packaging by, for example discrete conductive elements in the form of balls, bumps or studs of a metal material. The GPU would have integrated SRAM cache memory, which as noted above presents fabrication problems and necessitates the use of TSVs in the GPU. The microelectronic device assembly would locate the memory device over and operably coupled to an interface die being operably coupled to circuitry carried by the interposer, by which circuitry memory die of the memory device would communicate with the host device. TSVs extending through the interposer would, in turn, communicate with a laminate substrate, which might comprise multiple levels of circuitry separated by dielectric material, and which circuitry would be operably coupled to discrete conductive elements on side thereof opposite the interposer for connection to external circuitry.

Another example of a proposed microelectronic device assembly to address the issues mentioned above would employ an interposer comprising a core of semiconductor material (e.g., silicon) with RDLs on opposing sides thereof, each RDL having multiple (e.g., four or more) layers of conductive traces to accommodate the high-speed, high-capacity signal requirements of HBM designs and, specifically HBMx (also termed HBM2, HBM 2e, HBM3 and HBM4) designs, incorporating a stack of memory (i.e., DRAM dice) and a host in the form of a graphics processor unit (GPU) or central processor unit (CPU). Applications for such proposed designs would include graphics, client, server, network and high performance computing. However, fabrication of a silicon interposer bearing back-to-back RDLs presents issues in terms of process cost and complexity and quality control.

Semiconductor (e.g., silicon) interposer structures comprising multiple stacked interposers are disclosed, as well as microelectronic device assemblies including such interposer structures, and methods of fabricating such assemblies.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing an HBM device, a silicon interposer structure, a GPU, CPU or other processor, or a microelectronic device assembly including HBM devices, a GPU, CPU or other processor and a silicon interposer structure. Only those process acts and structures necessary to understand the embodiments of the disclosure are described in detail below. Additional acts to form a complete HBM device, silicon interposer structure, GPU, CPU or other processor, or a microelectronic device assembly including the foregoing may be performed by conventional fabrication processes known to those of ordinary skill in the art in the semiconductor and electronics industry.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As described in more detail below, the specification describes various embodiments of a stacked interposer structure comprising multiple, vertically stacked interposers. Embodiments include various configurations of stacked interposers, each interposer of a stack including a semiconductor core, such as a silicon core and bearing a redistribution structure on one side thereof. In embodiments, the redistribution structures include multiple individual redistribution layers. The multiple individual redistribution layers may be implemented, in some embodiments, to provide high bandwidth communication capability between microelectronic devices connected through the interposers.

Additionally, the specification describes incorporation of circuit elements, including active and passive circuit elements that may be formed in an interposer. In some embodiments, the active and passive circuit elements will be formed at least in part in the semiconductor core. In some examples, circuit elements may have one or more bodies formed within the semiconductor core and one or more bodies formed in material structures formed over the semiconductor core.

Referring now to the drawings in more detail, and particularly to FIGS. 1A-1E, FIG. 1A depicts a simplified representation of an embodiment of a microelectronic device assembly 100 including a processor 102 and multiple memory devices 104A, 104B, 104C, 104D, connected to an assembly of stacked interposers 106A and 106B, each interposer 106A and 106B comprising semiconductor material (e.g., silicon) in accordance with one or more of the configurations described herein.

As will be apparent to persons skilled in the art, processor 102 may be any of multiple configurations of a processor (e.g., a central processing unit (CPU), a graphics processing unit (GPU), a controller), a system on a chip (SoC)), or some other form of host device. Memory devices 104A, 104B, 104C, 104D may be of the same or different forms; and any of the memory devices may be either a single die or a stack of interconnected memory die, as discussed in more detail in reference to FIG. 1E. The representation of FIG. 1A depicts each memory device 104A, 104B, 104C, 104D as a stack of multiple memory die 108A-108H. In some embodiments, the memory devices 104A-104D coupled to stacked interposers 106A and 106B may all be of comparable heights. Non-limiting examples of existing memory devices 104A-104D include JEDEC-standard HT3M memory devices and Hybrid Memory Cube (HMC) memory devices, both RBM and HMC assemblies comprising multiple, vertically stacked DRAM die. However, HMC memory devices employ a TSV-equipped logic die, whereas HBM memory devices do not.

The processor 102 may exchange information with one or more of memory devices 104A, 104B, 104C, 104D using signals communicated over signal paths formed at least in part within and between interposers 106A and 106B. Such signal paths include a path that a message or transmission may take in communicating from a transmitting component to a receiving component. In some cases, a signal path may be a conductor coupled with at least two components, where the conductor allows electrons to flow between the at least two components. In some cases, the signal path may be formed at least in part in a wireless medium as in the case for wireless communications (e.g., radio frequency (RF) or optical). In some examples, stacked interposers 106A and 106B will be coupled to an external structure, such as a package substrate, a motherboard, etc., to form part of a larger system.

In some applications, microelectronic device assembly 100 may benefit from a high-speed connection between the processor 102 and one or more of memory devices 104A, 104B, 104C, 104D. As a result, in some examples, one or more of memory devices 104A, 104B, 104C, 104D will support applications, processes, or processors that have multiple terabytes per second (TB/s) bandwidth needs. Such applications may include a serializer/deserializer ("SerDes") between the memory and a processor or other logic devices requiring high bandwidth. Satisfying such a bandwidth constraint within an acceptable energy budget may pose challenges in certain contexts.

The memory devices 104A, 104B, 104C, 104D and interposers 106A and 106B may be configured such that the signal path between memory cells in the memory devices 104A, 104B, 104C, 104D and the processor 102 are as short as the material properties, operating environment, component layout, and application allow. For example, the memory devices 104A, 104B, 104C, 104D may be bufferless memory devices with a point-to-point connection between the host device and the memory array. In other examples, the data channels coupling a memory device 104A, 104B, 104C, 104D with the processor 102 may comprise a point-to-many configuration, with one pin of the processor 102 coupled with corresponding pins of at least two memory arrays (which may be located in the same or different memory die 108A-108H, and/or memory devices 104A-104D).

Many interposers may be formed to have multiple arrays of contacts configured to interconnect with each of multiple devices (such as, in the example of FIG. 1A, processor 102 and memory devices 104A-104D). For purposes of the present description, each of the depicted devices is coupled to interposer 106A at a respective mounting site; and at each mounting site interposer 106A includes one or more arrays of contacts arranged and configured to engage complementary arrays of contacts on each of processor 102 and memory devices 104A-104D). A second interposer 106B is stacked under interposer 106A, and functions in cooperation with interposer 106A as a unit for signal communication between processor 102, memory devices 104A-104D, and higher-level packaging.

Figure 1B:
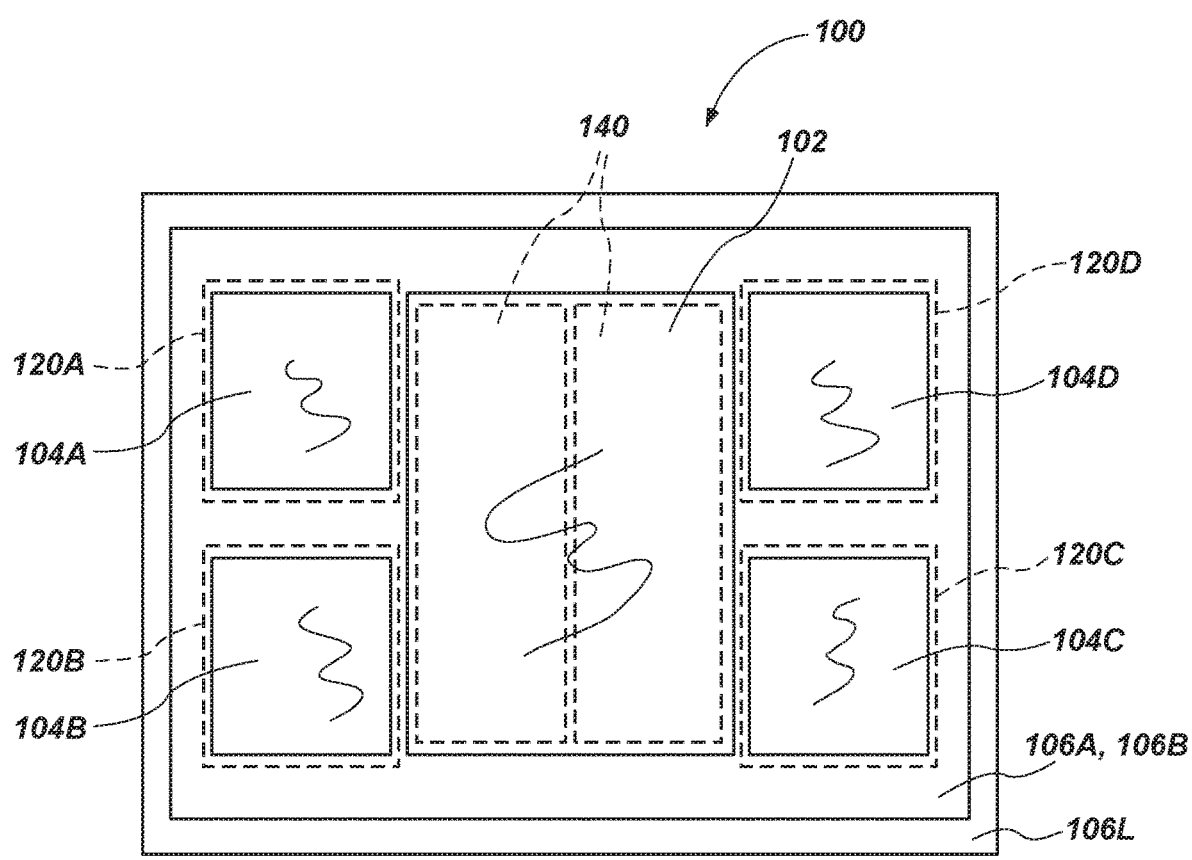
FIG. 1B is a schematic top elevation of a microelectronic device assembly of FIG. 1A, including multiple memory devices and the processor supported on and operably coupled the stacked interposer structure.
Figure 1C:
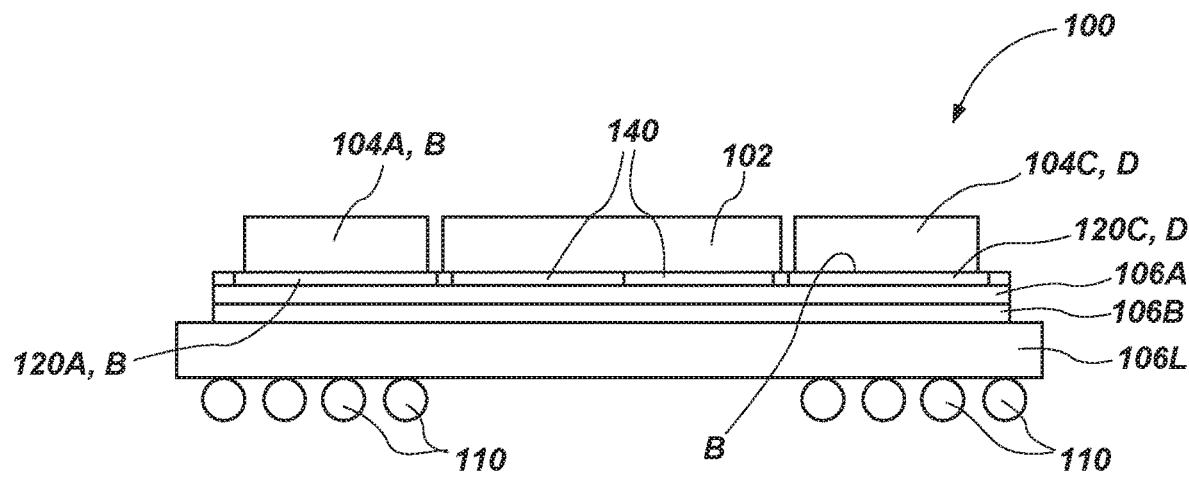
FIG. 1C is a schematic side elevation of the microelectronic device assembly of FIG. 1A and FIG. 1B according to an embodiment of the disclosure, depicting the components of FIGS. 1A and 1B with the stacked interposer structure mounted to a laminate substrate having conductive elements on an opposing side thereof for connection to higher-level packaging.

FIG. 1B depicts a top elevation of one implementation of the microelectronic device assembly 100 of FIG. 1A, and FIG. 1C depicts a schematic side elevation. As shown, memory devices 104A-104D are located at peripheral sites on interposer 106A on laterally opposing sides of processor 102, in this instance comprising, for example, a GPU. Optionally, and as shown in broken lines in FIG. 1B within the boundaries of processor 102, cache memory in the form of SRAM 140 has been fabricated over an active surface of the silicon of interposer 106A to reside under processor 102 and operably couple processor 102 to memory devices 104A-104D through circuit traces of a Back End of Line (BEOL) structure B (FIG. 1C) carried by interposer 106A over the active surface of the silicon to memory devices 104A-104D and to circuitry external to microelectronic device assembly 100 through cooperatively configured and operably coupled interposer 106B. However, such a memory configuration is not essential to implementation of embodiments of the present disclosure, and cache memory may, as noted, above, be incorporated in the GPU or reside under the GPU. BEOL structure B comprises multiple layers, each comprising a dielectric material and a level of conductive traces, the various conductive levels being vertically interconnected, as known to those of ordinary skill in the art, and may function as a redistribution structure as further described below. Also as shown in FIG. 1B in broken lines adjacent the boundaries of each memory device 104A-104D, interface circuitry segments 120A-120D have been fabricated over the active surface of the silicon of interposer 106A to reside, respectively, immediately below locations of each of memory devices 104A-104D and operably couple memory devices 104A-104D to processor 102 through conductive traces of BEOL structure B. Circuitry of interposer 106A is operably coupled to circuitry of interposer 106B which, in turn, may, optionally, be coupled to circuitry of laminate substrate 106L through TSVs extending through interposers 106A and 106B, circuitry of laminate substrate 106L being operably coupled to discrete conductive elements 110 for connection to higher-level packaging. Interposer 106B includes a redistribution structure fabricated by BEOL processing and comprising multiple redistribution layers (RDLs), each RDL comprising a dielectric material and a level of conductive traces, the conductive traces being operably coupled to conductive paths of BEOL structure B through TSVs.

Figure 1D:
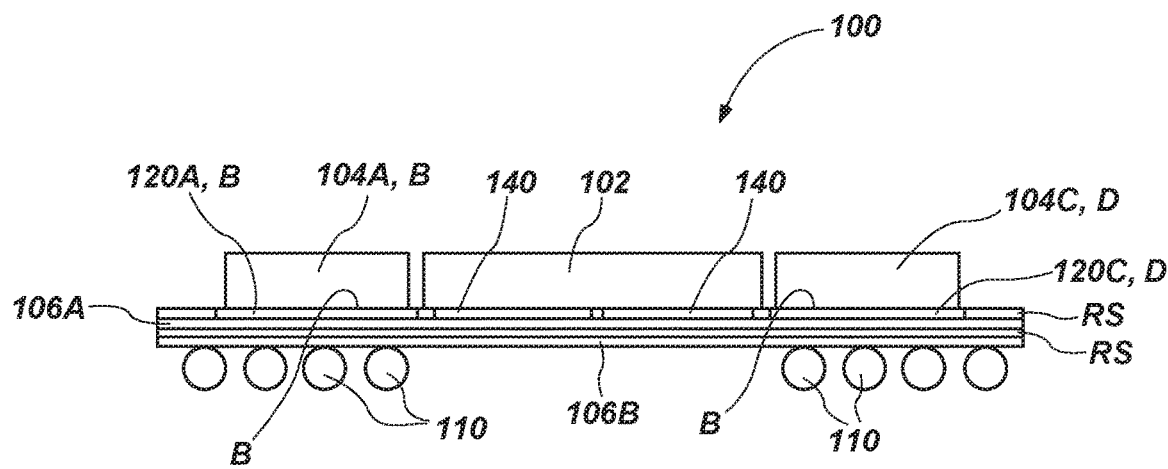
FIG. 1D is a schematic side elevation of the microelectronic device assembly of FIG. 1A and FIG. 1B according to an embodiment of the disclosure, depicting the components of FIG. 1A and FIG. 1B without a laminate substrate, a lower interposed of the stacked interposer structure having conductive elements on a side thereof opposite the microelectronic devices for connection to higher-level packaging.

FIG. 1D depicts a side elevation of another implementation of the microelectronic device assembly 100 of FIG. 1A. As depicted in FIG. 1D, a laminate substrate is omitted from the assembly, in lieu of which, interposer 106B is operably coupled to discrete conductive elements 110 for connection to higher-level packaging. Each interposer 106A, 106B includes a redistribution structure RS comprising multiple redistribution layers (RDLs), each RDL comprising a dielectric material and a level of conductive traces. In one embodiment (not indicated in FIG. 1D), the redistribution structure RS of interposer 106B faces away from interposer 106A, and carries discrete conductive elements 110 on under-bump metallization (UBM) as is known to those of ordinary skill in the art. In another embodiment and as shown in FIG. 1D, the redistribution structure RS of interposer 106B faces interposer 106A, and discrete conductive elements 110 for connection to higher-level packaging are operably coupled to TSVs extending from the redistribution structure RS through the core of semiconductor material of interposer 106B for connection to higher-level packaging.

In the embodiment of FIGS. 1A through 1D, it will be apparent to those of ordinary skill in the art that optional placement of cache memory in the form of SRAM in close proximity to, and immediately below the GPU reduces signal length and latency while relieving the GPU of SRAM which would otherwise consume valuable real estate and simplifying the processor design.

Figure 1E:
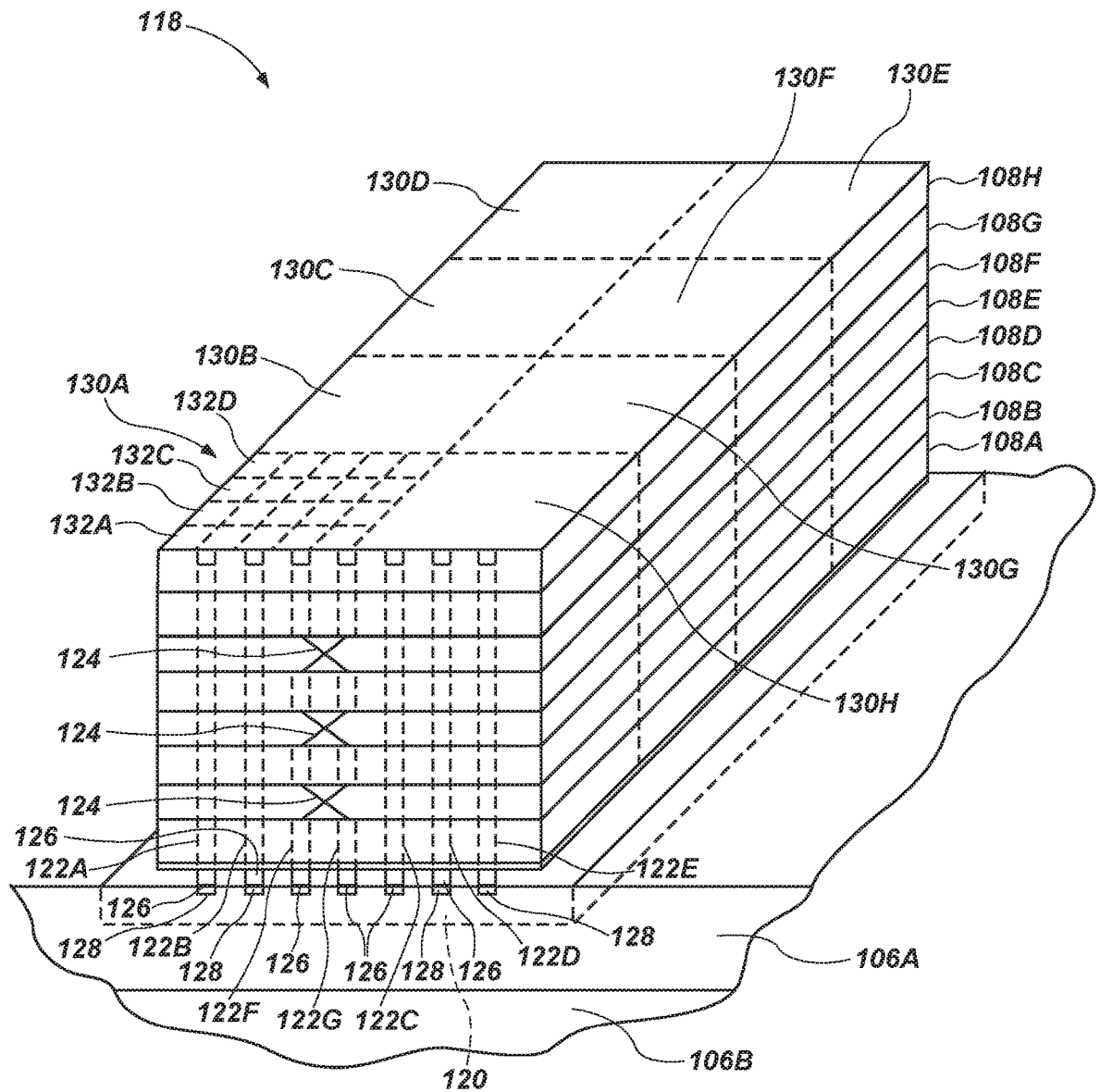
FIG. 1E is a schematic perspective view of a memory device of FIG. 1A in the form of an HBM cube including multiple memory dice stacked on an interface circuitry segment integrated within the interposer.

FIG. 1E depicts an example memory device 118 suitable for use in microelectronic device assembly 100 of FIG. 1A as memory devices 104A-104D. Memory device 118 includes, as an example, eight individual memory die 108A-108H that are vertically stacked and interconnected. As noted previously, memory device 118 may include only a single memory die, or any other number of stacked memory die for example, two memory die, four memory die, and/or more than eight memory die, for example twelve, sixteen, thirty-two or sixty-four memory die.

One example structure for forming the vertical interconnections includes multiple through silicon vias ("TSVs"). Though the term "through silicon vias" ("TSVs") taken literally suggests vias that extend through a silicon body, the term is conventionally used in the art to refer to vertical interconnects extending through not only silicon, and not only semiconductors, but to vertical interconnects extending through other materials as well. The term is used herein in this broader meaning, and as used herein does not imply that the described vias may extend only through a silicon body.

Each memory die 108A-108H includes multiple memory cells that are programmable to store different logic states. For example, each memory cell may be programmed to store one or more logic states (e.g., a logic '0,' a logic '1,' a logic '00,' a logic '01,' a logic '10,' a logic '11'). The memory die may use one or more of different storage technologies to store data including DRAM, SRAM, ferroelectric RAM (FeRAM), Resistive RAM (RRam or ReRAM), phase change memory (PCM), 3D XPoint™ memory, NAND flash memory, NORflash memory, or other memory technologies known to persons skilled in the art, and/or a combination thereof.

In a memory device such as 118, all of the stacked memory die may implement a first memory technology (e.g., DRAM); or alternatively one or more of the stacked memory die may include memory cells of a different storage technology different from the first memory technology. Alternatively, any of the above types of memory devices may be stacked in combination within memory device 118.

Additionally, memory device 118 depicts a configuration in which the stacked memory die are stacked above an interface circuitry segment 120A-120D of interposer 106A. Interface circuitry segment 120 can be any of many different configurations, and when present, may implement logic functions relating to operation or management of the memory die of a memory device 104A-104D stacked on an associated interface circuitry segment 120A-D. The interface circuitry segment 120A-120D interfaces with other circuitry of interposer 106A and interposer 106B, and with processor 102 through BEOL structure B (FIG. 1C). In some embodiments, the lowermost memory die 108A will include contacts 126 which may, for example, comprise conductive pillars or micro-bumps, for interfacing with an associated interface circuitry segment 120A-120D. In many examples, the contacts 126 will be arranged in one or more arrays configured to engage a respective device mounting site comprising contacts 128 of an interface circuitry segment 120A-120D of interposer 106A.

In some examples, the vertically interconnected memory die 108A-108H may be interconnected through an array of TSVs extending essentially linearly and vertically through the stacked memory die 108-108H (though not necessarily through the uppermost stacked memory die 108H), as depicted at 122A, 122B, 122C, 122D, 122E. In one of many alternate configurations some TSVs through individual die may be cross-connected to interleave vertical connections through the stacked memory die. For example, in one such embodiment, as depicted, the conductive paths may alternate between TSV paths in alternate die within the stack, as schematically depicted at 124, in conductive paths 122F-122G. Other, more complex, interleaved conductive paths may also be implemented. In some examples, one or more of the conductive paths as will connect to each of the stacked memory die; while in other examples a vertical conductive path may only electrically connect to communicate with other circuitry in a subset of the stacked memory die. For example, in the context of memory device 118 some TSVs might extend directly through the lowermost memory die 108A-108D without connecting with other circuitry; and form electrical interconnections with circuitry only in the upper half of the stacked memory die 108E-108H. In other examples, TSVs might form electrical connections only with alternating die within a stack of memory die.

Additionally, individual memory die 108A-108H, or some portion thereof, may each contain multiple partitions (as indicated at 130A-130H on memory die 108H). Some or all of memory die 108A-108H may be partitioned similarly. These partitions (or some subset thereof), may be vertically interconnected with corresponding partitions of other memory devices in the stack through the above discussed vertical connections, forming an independently operable memory unit. In some examples, the memory unit can include two or more vertically aligned partitions; and in some examples may include vertically aligned partitions from all memory die in the stack. As indicated in partition 130A, each partition may be further subdivided into multiple banks or other subdivisions, such as individual memory channels. As one example, four banks (as indicated at 132A-132D, defining four banks) are formed within partition 130A, with each bank including further subdivided units, for example representing individual memory channels (indicated typically at 134). In some examples, these further subdivisions will be vertically interconnected in the same manner as described for the partitions to include portions of memory in multiple, or all, memory die in the stack, which may then be operated as a group.

Figure 2:
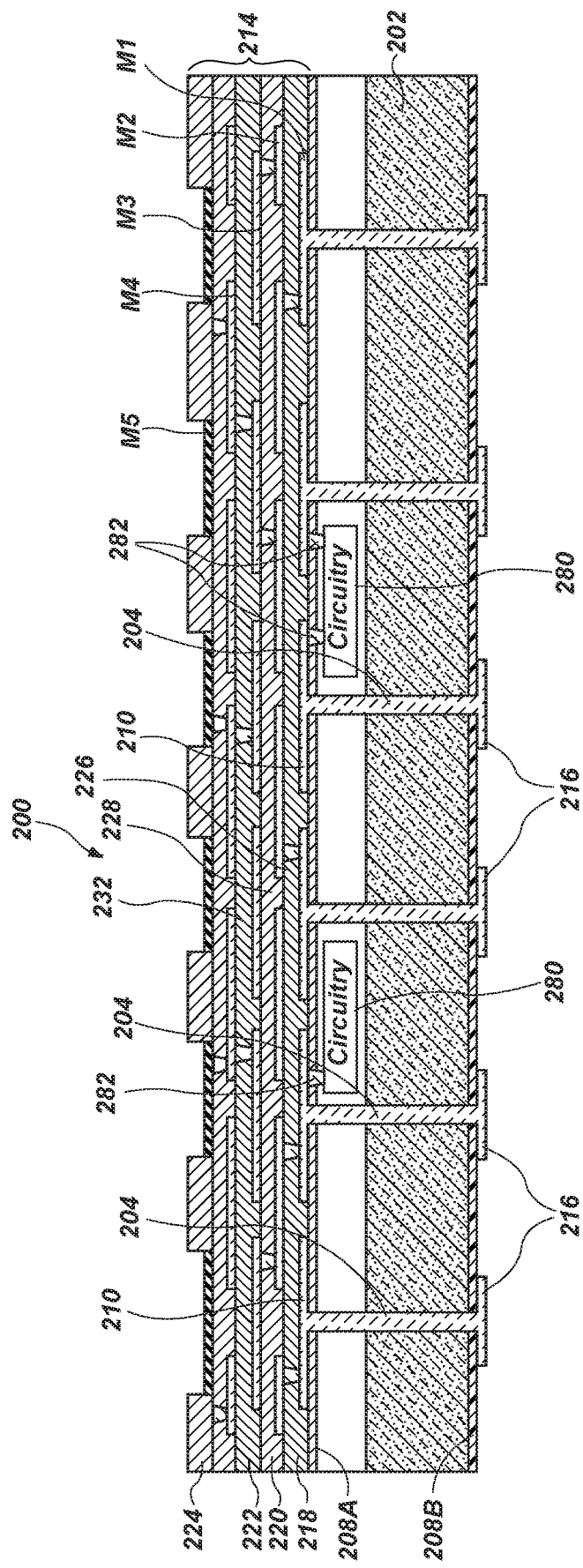
FIG. 2 is a side sectional schematic elevation of an interposer comprising a semiconductor core according to embodiments of the disclosure.

Referring now to FIG. 2, the figure depicts a simplified cross-sectional representation of an embodiment of interposer 200 suitable for use in implementation of embodiments of the disclosure comprising assemblies of memory and a host device, for example a processor. Interposer 200 includes a semiconductor core, which for purposes of the present example will be described as a silicon core 202 having multiple TSVs 204 extending through silicon core 202. As is known to persons skilled in the art, TSVs 204 each include a conductive structure, commonly a metal, extending within an insulator isolating the conductive structure from the surrounding silicon. By utilizing a silicon core 202, TSVs can be arranged in a more compact spacing than would be feasible with current organic interposer technology. In some examples, for example, TSVs may be arranged at a pitch of 40 µm or less, for example, a pitch of approximately 20 µm. In many examples, the pitch of at least some portion of the TSVs will be sized to match a contact pitch of the semiconductor die or other devices coupled to interposer 200. In such examples, the contact pitch of TSVs can correspond to the contact pitch(s) of the die or other device coupled to interposer 200. In the depicted example, a conductive level (designated M1) extends "over" a side of core 202, conductive level M1 electrically insulated from the core 202 by a respective dielectric level 208A (which may include one or more dielectric materials). The term "over" is used in the present description for clarity, and refers to the material or level being relatively outward from the core 202. As will be recognized by persons of skill in the art, the materials and structures to one side of the core will typically be formed at different times, during which the respective side of the core over which a material is being formed will face directionally upward. Similarly, the to in "under" is used herein to denote a structure closer to the core.

Conductive level M1 will in many examples be patterned to define conductive traces 210, at least some of which will interconnect with respective TSVs 204, as depicted. Some conductive traces 210 may not connect with respective TSVs, and may just provide interconnection for conductive traces formed above conductive level M1. The term "redistribution layer" or "RDL" is used in the industry in multiple contexts sometimes to refer to a single level of a multi-level structure, and sometimes to refer to the multi-level structure itself. Herein, for clarity, the term "redistribution layer" or "RDL" is used to refer to a respective dielectric level supporting a respective metal level (as discussed below); and the term "redistribution structure" will be used to refer to multiple overlying individual RDLs as a group. Redistribution structures as described herein may be fabricated using BEOL techniques known to those of ordinary skill in the art and may correspond in structure and function to BEOL structures B as previously described herein with respect to FIGS. 1B through 1D.

A first redistribution structure 214 may be formed over a first side of core 202. Redistribution structure 214 includes multiple respective redistribution layers (RDLs). Each of the multiple RDLs, in the example, redistribution structure 214 includes four RDLs, although the number of RDLs is not so limited, and it is contemplated that a greater number of RDLs, for example six RDLS, may be employed in a redistribution structure to accommodate power and bias (e.g., ground) as well as signal transmission. In redistribution structure 214, RDLs 218, 220, 222, 224, extend over a first side of core 202 and metal level M1 formed thereon. Each RDL includes a respective dielectric level 226, 228, 230, 232, each dielectric level 226, 228, 230, 232 supporting a respective metal (or other conductive material) level M2, M3, M4, M5. Each metal level M1-M5 will preferably be patterned to collectively form conductive traces to redistribute contacts of a semiconductor die or other microelectronic device or structure mounted to interposer 200 to desired locations within interposer 200. Of course, as noted above, a redistribution structure in the form of four RDLs is by way of example only, and a different number of RDLs may be employed.

In some examples, all metal levels M1-M5 may be formed of the same metal. In other examples, however, outermost metal level M5 will typically form surfaces for connecting (directly or through an interconnection structure) with complementary contact structures of another device. In the case of outermost metal level M5, the level will form surfaces suitable connecting with contacts of a semiconductor die, or other microelectronic device. As a result of the different functions of these metal levels, and the likely exposure of the metal to potentially oxidizing environments after formation, in some examples one or both of the outermost metal levels may be formed of another conductive material that oxidizes more slowly than the metal used for used for other levels. For example, in examples in which metal levels M1-M4 are formed of copper, outermost metal level M5 may be formed of aluminum. As will be apparent to persons skilled in the art having the benefit of this disclosure, other conductive materials and/or other metals may be used for any one or more of conductive levels corresponding to metal levels M1-M5.

In many examples, the dielectric levels of the RDLs will comprise primarily, or in significant part, a polyimide compound. In general, a polyimide compound will be more elastic, and less prone to cracking, than other dielectric materials used in other locations in semiconductor manufacturing (such as silicon oxide (in various forms), silicon nitride, etc.). Additionally, the polyimide material may be formed at lower temperatures than other materials used in build-up applications, thereby minimizing stress on core 202 during manufacture of interposer 200.

Interposer 200 may further include circuitry 280 formed within the dimensions of core 202. In some embodiments, circuitry 280 may include passive components (such as resistors, inductors, capacitors) that may be formed, at least in part, in the bulk semiconductor (silicon) of core 202. In other examples, the components may be formed, at least in part, of materials deposited in recesses formed in core 202. In some examples, the passive components may be formed entirely within the dimensions of the core. In such examples, individual circuit elements may connect outside of the core through interconnection to one or more TSVs 204 extending through core 202, or through one or more micro-vias 282 formed as a portion of M1 formed over the upper surface of core 202, and extending through dielectric level 208A over the first surface of core 202. In some cases, multiple passive components may be connected to one another. For example, resistors and capacitors may be coupled together to form a resistor/capacitor circuit. As one example, such a resistor/capacitor circuit, or an inductor, may be coupled and adapted to condition signals on conductive traces extending through one or more of the RDL layers of redistribution structure 214.

In embodiments of the disclosure, active circuit components may be located within the dimensions of core 202. Many forms of circuitry including active components will beneficially be formed with one or more bodies within the bulk silicon of core 202, with one or more additional bodies formed in materials extending over core 202. In many forms of such devices, regions of silicon core 202 may be isolated from one another by shallow trench isolation in silicon core 202; and isolated regions of silicon core 202 may be doped relative to the remaining silicon of silicon core 202. Specifically, and as noted above, interface circuitry segments 120A-120D may be formed within or over core 202. In addition, as described with respect to FIGS. 1A-1 D, cache memory in the form of SRAM may be formed within and over core 202 at least partially under the footprint of processor 102.

With continued reference to FIG. 2, TSVs 204 extend from metal level M1 through core 202 of interposer 200, for connecting individual circuit elements outside of core 202, but also for connecting metal levels M2-M5 and, therefore, data, power and bias (e.g., ground) signals to and from microelectronic devices, such as memory and processor, mounted to interposer 200 and connected by contacts 126 (FIG. 1E) to metal level M5. TSVs 204 extend through core 202 from metal level M1 and through dielectric level 208B to another metal level M6 opposite M1, metal level M6 comprising conductive pads 216.

By way of example only, the semiconductor material core 202 of interposer 200 may be of a thickness of about 50 μm or less, for example about 30 μm. TSVs 204 may be of a diameter of about 5 μm. Fabrication of active and passive circuitry 280 may be effected by techniques known to those of ordinary skill in the art of semiconductor device fabrication, for example memory device fabrication. Redistribution structure 214, comprising multiple RDLs 218, 220, 222 and 22 may be fabricated by BEOL techniques known to those of ordinary skill in the art of semiconductor device fabrication. Similarly, TSVs 204 may be initially fabricated in the form of blind holes, for example of about 65 μm depth in semiconductor core of a greater thickness, for example a partially thinned wafer of about 100 μm thickness, the blind ends revealed by thinning of the core, and back side pads (i.e., conductive pads 216) formed on the revealed ends by blanket conductive material deposition and patterning, all as known to those of ordinary skill in the art of semiconductor device fabrication. Such dimensions and processing techniques are equally applicable to all of the interpose embodiments of the present disclosure.

Notably, another interposer 200 may be fabricated for stacking with and connection to the interposer 200 described above for connection to that interposer 200 in a same or in an "inverted" orientations with different patterns of metal levels M1-M5 and conductive pads 216 for stacking with the other interposer 200 to provide a redistribution structure comprising eight (8) metal levels, as well as additional passive and active circuitry as described above, which passive and active circuitry may be the same as, or different from, the circuitry employed in the first interposer, the stacked interposers 200 being connected through conductive elements extending between conductive pads 216. If a second interposer 200 is fabricated for connection to a first interposer 200 in a similar orientation (i.e., redistribution structures facing in the same direction), conductive pads 216 of the second interposer 200 may be employed for connection of the assembly to higher-level packaging, such as a motherboard. When an interposer is configured for use in an inverted orientation, unlike an interposer 200 configured for direct connection of microelectronic devices, the metal level M5 of the redistribution structure of the inverted interposer may be configured with conductive pads for connection to higher-level packaging, for example a motherboard, while metal level M6 is employed for connections to the first interposer 200. In either implementation, the patterns of TSVs through the cores 202 of respective first and second interposers 200 may also be the same or different if, for example conductive pads 216 may be employed with circuit traces to reroute signals between a first interposer and a second interposer having mutually offset TSVs.

By way of further elaboration, and with reference to FIGS. 3A-3C, a first embodiment of stacked interposers 200 with redistribution structures 214 facing in the same direction, and a microelectronic device assembly 300 incorporating same, will be described. Elements previously described with FIG. 2 are identified with the same or similar reference numerals for convenience.

Figure 3A:
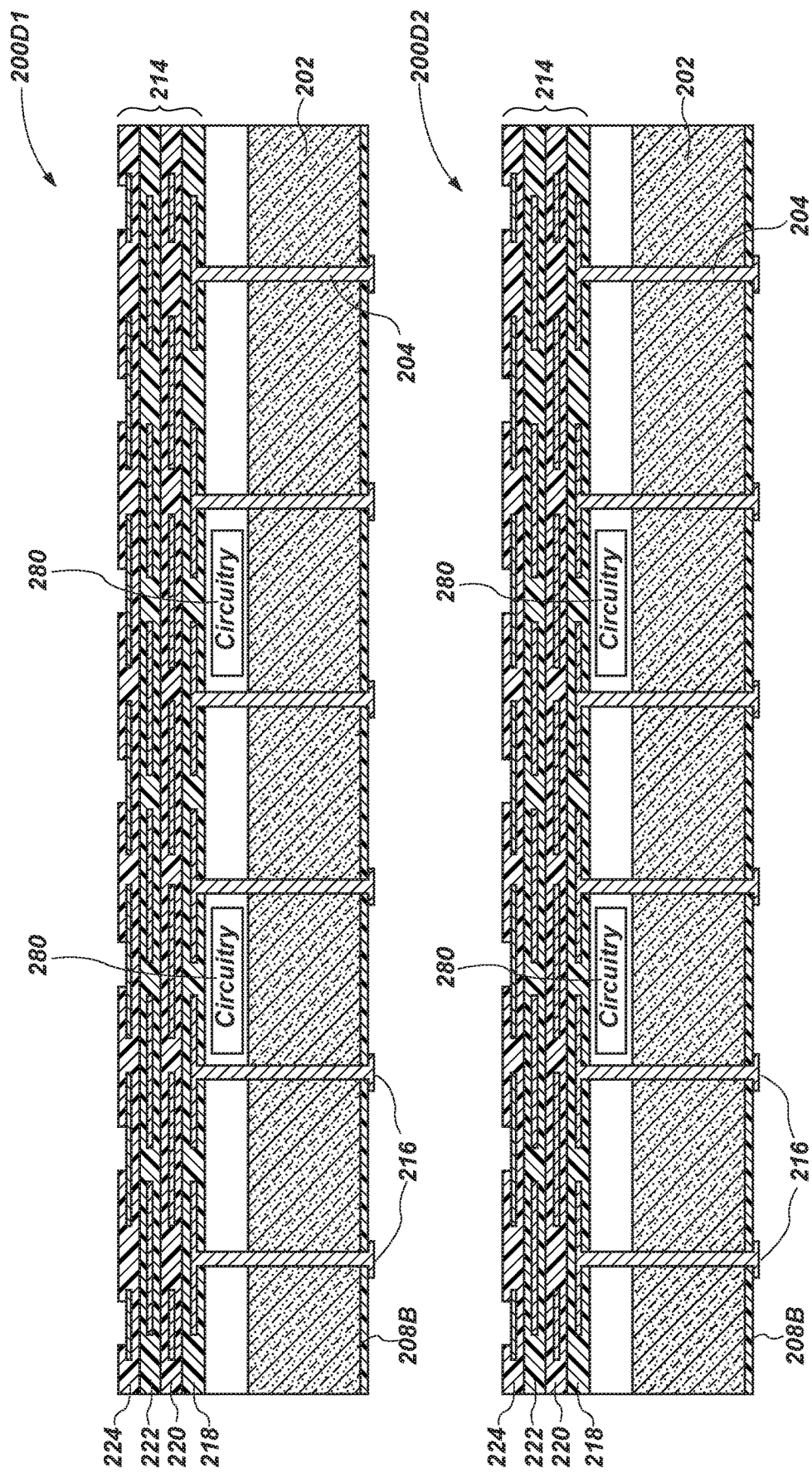
FIGS. 3A-3C are schematic side elevation of, respectively, two cooperatively configured interposers with a semiconductor core, the two interposers stacked together to form a stacked interposer structure, and a microelectronic device assembly comprising a memory device and a host device according to an embodiment of the disclosure.

Referring to FIG. 3A, a first interposer 200D1 of a first redistribution structure configuration comprising four RDLs 218, 220, 222, 224 and, optionally, a first passive and active circuitry configuration, is depicted above a second interposer 200D2 with a second redistribution structure comprising four RDLs 218, 220, 222, 224 and, optionally, second passive and active circuitry configuration. In both interposers as illustrated, first metal level M1 (see FIG. 2) has been omitted for clarity. Upper interposer 200D1 comprises a semiconductor (e.g., silicon) core 202, over which a redistribution structure 214 comprising four RDLs 218, 220, 222, 224 has been fabricated. Circuitry 280, comprising passive circuitry, active circuitry, or both may, optionally, be located within core 202 under redistribution structure 214. TSVs 204 extend from redistribution structure 214 through core 202 and through dielectric level 208B to conductive pads 216.

Still referring to FIG. 3A, lower interposer 200D1 comprises a semiconductor (e.g., silicon) core 202, over which a redistribution structure 214 comprising four RDLs 218, 220, 222, 224 has been fabricated on an upper side thereof, the redistribution structures 214 of both upper interposer 200D1 and lower interposer 200D2 are facing in the same direction. The conductive paths of RDLs 218, 220, 222, 224 of redistribution structure 214 of lower interposer 200D2 are different from that of redistribution structure 214 of upper interposer 200D1, and cooperatively configured for signal and, optionally, power and ground transmission. Circuitry 280, comprising passive circuitry, active circuitry, or both may, optionally be located within core 202 under redistribution structure 214. TSVs 204 extend from redistribution structure 214 through core 202 and through dielectric level 208B to conductive pads 216.

Figure 3B:
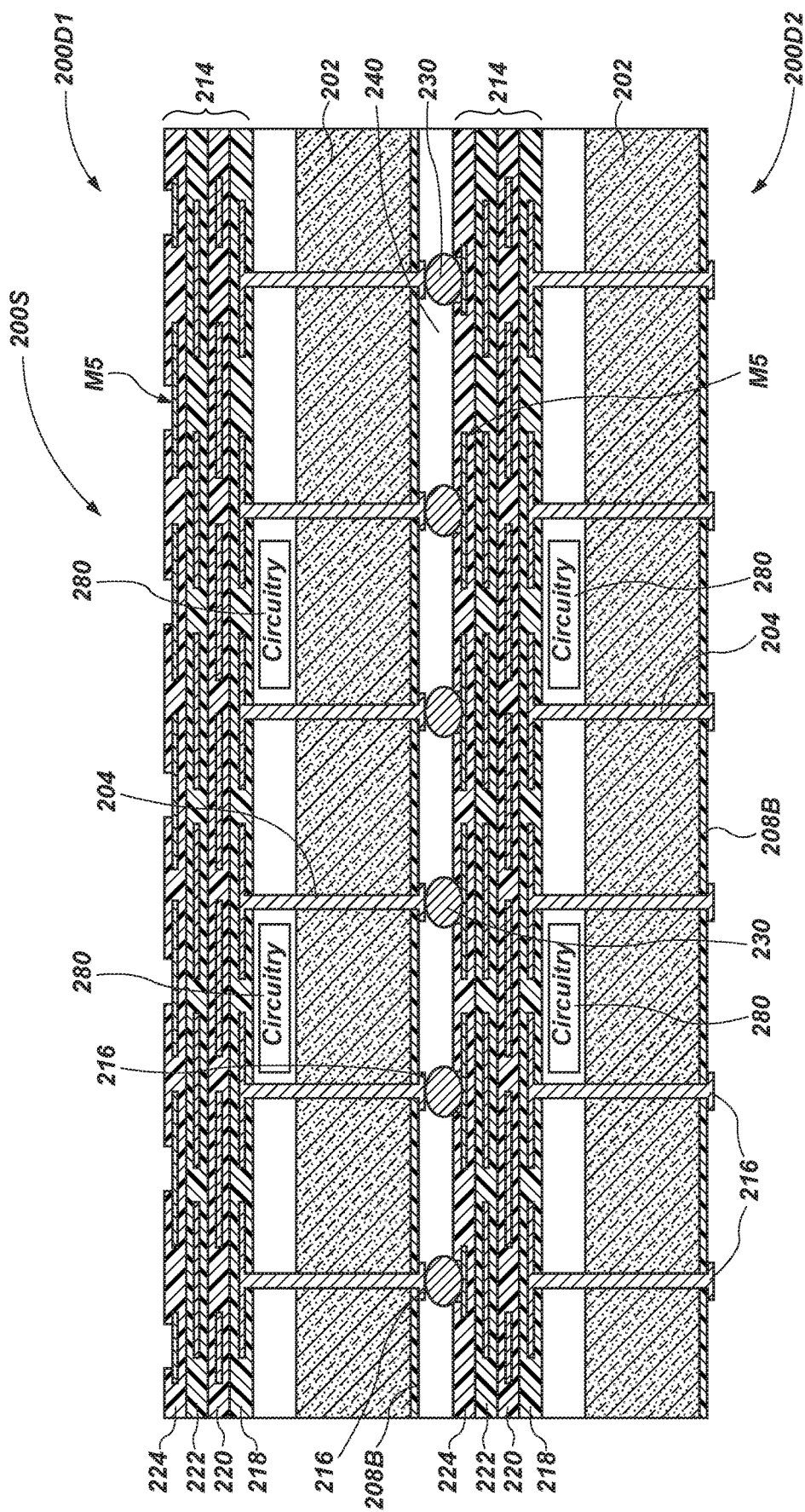

Referring to FIG. 3B, interposer 200D1 is stacked over interposer 200D2, and physically and electrically connected thereto by conductive elements 230 bonded to conductive pads 216 of interposer 200D1 and conductive pads of metal level M5 of interposer 200D2 to form stacked interposer structure 200S. Conductive elements 230 may, for example, comprise solder-capped copper pillars bonded to conductive pads in a reflow process, copper pillars bonded to copper pads in a diffusion bonding process, solder balls reflowed, gold stud bumps, oxide bonding (also termed oxide bonding, involving Cu—Cu diffusion bonds), and covalent bonding of oxide passivation materials in the bond line, or other suitable direct chip attach technique. It is contemplated that conductive elements 230 may be employed with a non-conductive film (NCF) 240 interposed between interposer 200D1 and interposer 200D2 or, alternatively, a wafer level underfill (WLUF).

Figure 3C:
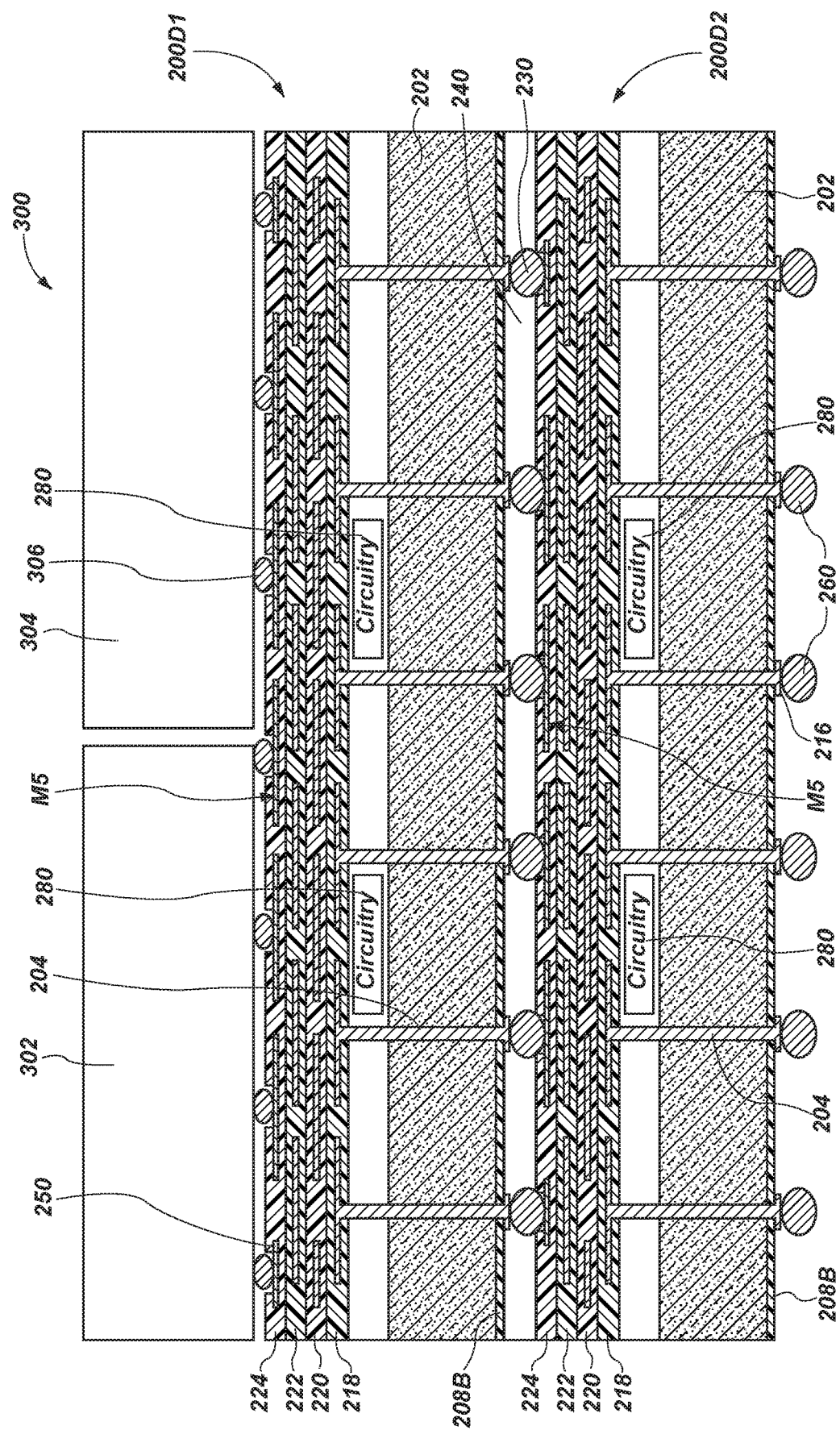

FIG. 3C depicts a microelectronic device assembly 300 of stacked and interconnected interposers 200D1 and 200D2 comprising stacked interposer structure 200S and having mounted thereto microelectronic devices and configured for connection to higher level packaging. Microelectronic devices include, by way of example only, a memory stack 302 of high bandwidth-configured DRAM die mounted on and operably coupled to interposer 200D1 of microelectronic device assembly 300. As noted previously, any suitable number of DRAM die may be incorporated in memory stack 302, for example four, eight, twelve, sixteen, thirty-two or sixty-four DRAM die. As depicted in FIGS. 1A-1D, more than one stack of memory die, and of more than one type, may be mounted to microelectronic device assembly 300. A processor 304 may also be mounted on and connected to interposer 200D1 of microelectronic device assembly 300. Processor 304 may comprise, for example, a graphics processing unit (GPU), a central processing until (CPU), a controller, or a system on a Chip (SoC). Memory stack 302 and processor 304 may each be physically and electrically connected to conductive pads 250 of metal level M5 of interposer 200D1 by, for example, solder-capped copper pillars, diffusion-bonded conductive pillars, solder bumps, micro bumps, or any other suitable conductive elements 306. Conductive elements 260 in the form of, for example, solder balls residing on conductive pads 216 of interposer 200D2 may be employed for connection of microelectronic device assembly 300 to higher-level packaging. Prior to application or formation of conductive elements 260, assembly 300 may be encapsulated with a dielectric molding compound, as known to those of ordinary skill in the art.

By way of further elaboration, and with reference to FIGS. 3D-3F, a second embodiment of stacked interposers 200 with redistribution structures facing in opposing directions, and a microelectronic device assembly incorporating same, will be described. Elements previously described with FIG. 2 are identified with the same or similar reference numerals for convenience.

Figure 3D:
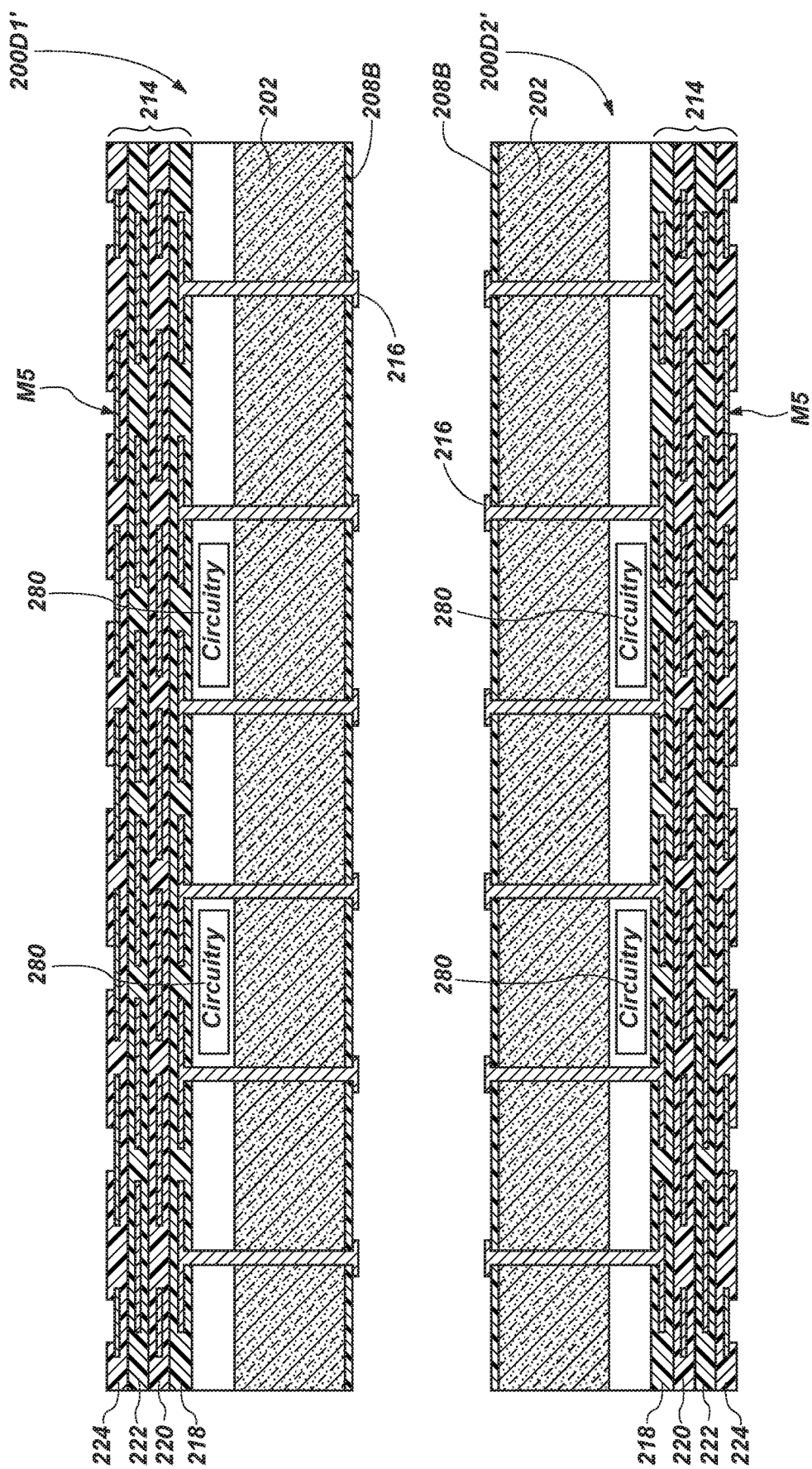
FIGS. 3D-3F are schematic side elevation of, respectively, two cooperatively configured interposers with a semiconductor core, the two interposers stacked together to form a stacked interposer structure, and a microelectronic device assembly comprising a memory device and a host device according to an embodiment of the disclosure.

Referring to FIG. 3D, a first interposer 200D1' of a first redistribution structure configuration comprising four RDLs 218, 220, 222, 224 and, optionally, a first passive and active circuitry configuration, is depicted above a second interposer 200D2' with a second redistribution structure comprising four RDLs 218, 220, 222, 224 and, optionally, second passive and active circuitry configuration. Upper interposer 200D1' comprises a semiconductor (e.g., silicon) core 202, over which a redistribution structure 214 comprising four RDLs 218, 220, 222, 224 has been fabricated. Circuitry 280, comprising passive circuitry, active circuitry, or both may, optionally be located within core 202 under redistribution structure 214. TSVs 204 extend from redistribution structure 214 through core 202 and through dielectric level 208B to conductive pads 216.

Still referring to FIG. 3D, lower interposer 200D2' comprises a semiconductor (e.g., silicon) core 202, over which a redistribution structure 214 comprising four RDLs 218, 220, 222, 224 has been fabricated on a lower side thereof, so that redistribution structures 214 of interposer 200D1' and 200D2' are facing in opposing directions. The conductive paths of RDLs 218, 220, 222, 224 of redistribution structure 214 of lower interposer 200D2' are different from that of redistribution structure 214 of upper interposer 200D1, and cooperatively configured for signal and, optionally, power and ground transmission. Circuitry 280, comprising passive circuitry, active circuitry, or both may, optionally be located within core 202 over redistribution structure 214. TSVs 204 extend from redistribution structure 214 through core 202 and through dielectric level 208B to conductive pads 216.

Figure 3E:
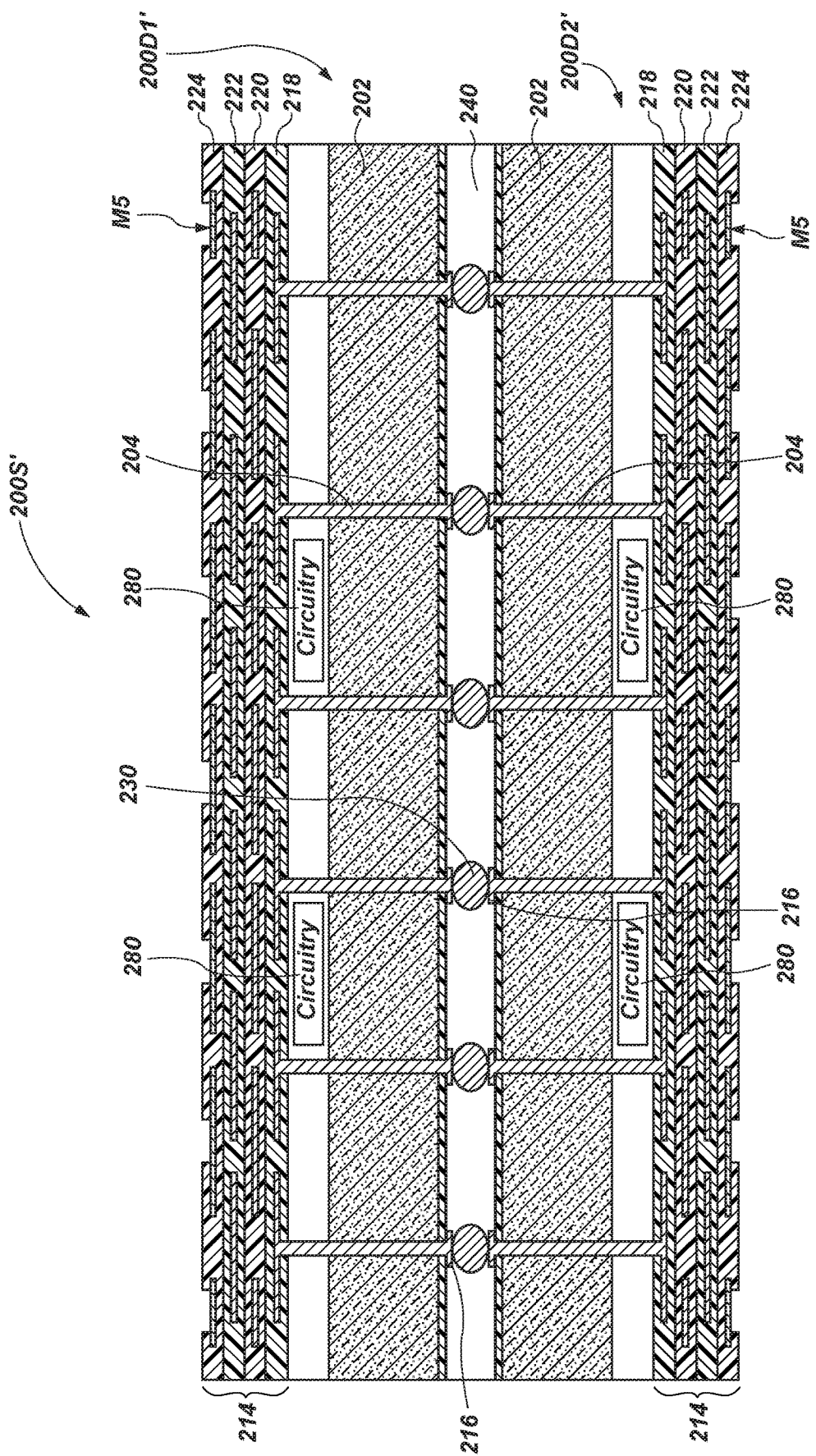

Referring to FIG. 3E, interposer 200D1' is stacked over interposer 200D2', and physically and electrically connected thereto by conductive elements 230 bonded to conductive pads 216 of interposer 200D1' and conductive pads 216 of interposer 200D2' to form stacked interposer structure 200S'. Conductive elements 230 may, for example, comprise solder-capped copper pillars bonded to conductive pads in a reflow process, copper pillars bonded to copper pads in a diffusion bonding process, reflowed solder balls, gold stud bumps, hybrid bonding (also termed oxide bonding, involving Cu—Cu diffusion bonds and covalent bonding of oxide passivation materials in the bond line), or other suitable direct chip attach technique. It is contemplated that conductive elements 230 may be employed with a non-conductive film (NCF) 240 interposed between interposer 200D1' and interposer 200D2' or, alternatively, a wafer level underfill (WLUF). Notably, the conductive paths in redistribution structures 214 of interposers 200D1' and 200D2' (and thus of stacked interposer structure 200S') may be different from those in redistribution structures 214 of interposers 200D1 and 200D2 (and thus of stacked interposer structure 200S), as will one or more of the number, spacing and pattern of TSVs 204 interconnecting the stacked interposers 200. Similarly, the type, number and locations of passive and active circuitry may differ between stacked interposer structures 200S and 200S'.

Figure 3F:
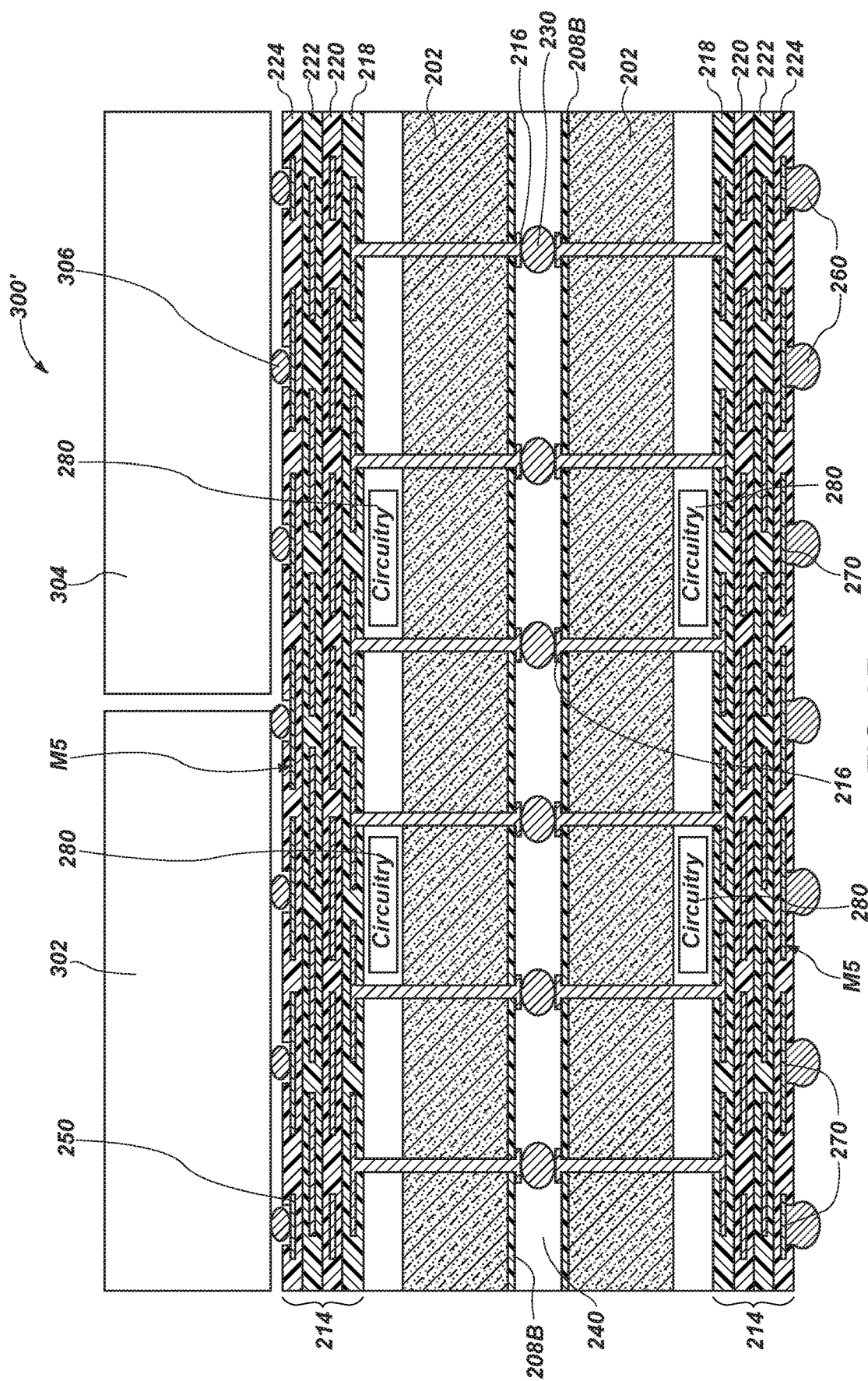

FIG. 3F depicts a microelectronic assembly 300' of stacked and interconnected interposers 200D1' and 200D2' having mounted thereto microelectronic devices and configured for connection to higher level packaging. Microelectronic devices include, by way of example only, a memory stack 302 of high bandwidth-configured DRAM die mounted on and operably coupled to interposer 200D1' of assembly 300'. As noted previously, any suitable number of DRAM die may be incorporated in memory stack 302, for example four, eight, twelve, sixteen, thirty-two or sixty-four DRAM die. As depicted in FIGS. 1A-1D, more than one stack of memory die, and of more than one type, may be mounted to microelectronic device assembly 300. A processor 304 may also be mounted on and connected to interposer 200D1' of assembly 300. Processor 304 may comprise, for example, a graphics processing unit (GPU), a central processing until (CPU), a controller, or a system on a Chip (SoC). Memory stack 302 and processor 304 may each be physically and electrically connected to conductive pads 250 of metal level M5 of interposer 200D1' by, for example, solder-capped copper pillars, diffusion-bonded conductive pillars, solder bumps, or any other suitable conductive elements 306. Conductive elements 260 in the form of, for example, solder balls residing on conductive pads 270 of metal level M5 of interposer 200D2' may be employed for connection of microelectronic device assembly 300' to higher-level packaging. Prior to application or formation of conductive elements 260, assembly 300' may be encapsulated with a dielectric molding compound, as known to those of ordinary skill in the art.

In embodiments depicted and described with respect to each of FIGS. 3A-3C and FIGS. 3D-3F, respectively, the circuitry, including traces, vias, active circuitry (if present) and passive circuitry (if present) in each cooperative combination of two stacked interposers comprising stacked interposer structures 200S and 200S' is designed to function as a single interposer, for example a single interposer having a core with redistribution structures on opposing sides thereof and operably coupled by conductive vias extending through the core and between the redistribution structures. However, embodiments of the stacked interposer designs of the present disclosure are far easier and less costly to fabricate, employing techniques already in use to fabricate active and passive circuitry in and on a semiconductor wafer and redistribution structures in the form of multiple RDLs on the wafer active surface. In addition, utilization of embodiments of the present disclosure may enhance throughput while increasing yield. For some examples, it will be desirable to form stacked interposers 200 with the same number of multiple RDLs in redistribution structures 214. As discussed later herein, in some examples the symmetrical structure may also be beneficial to conveying signals in multiple conductive channels (e.g., in some examples, with a first conductive channel implemented at least in part through metal levels M2-M5 in first redistribution structure 214, and a second conductive channel implemented at least in part through metal levels M2-M5 of second redistribution structure 214). Also, there may be an unequal number of RDLs on each interposer 200, and individual RDLs may have vertical dimensions different than other RDLs. Further, it is contemplated that more than two interposers 200 may be stacked in various cooperative configurations and orientations in instances where height limitations of an assembly incorporating stacked interposers are not an issue. In addition, it is contemplated that RDLs of respective interposers may be engineered to minimize warpage of the interposers, and that the embodiment of FIGS. 3A-3C may enable mirroring of any warpage (i.e., warping in the same direction) of the stacked interposers to minimize stress within the interposer cores.

Figure 4:
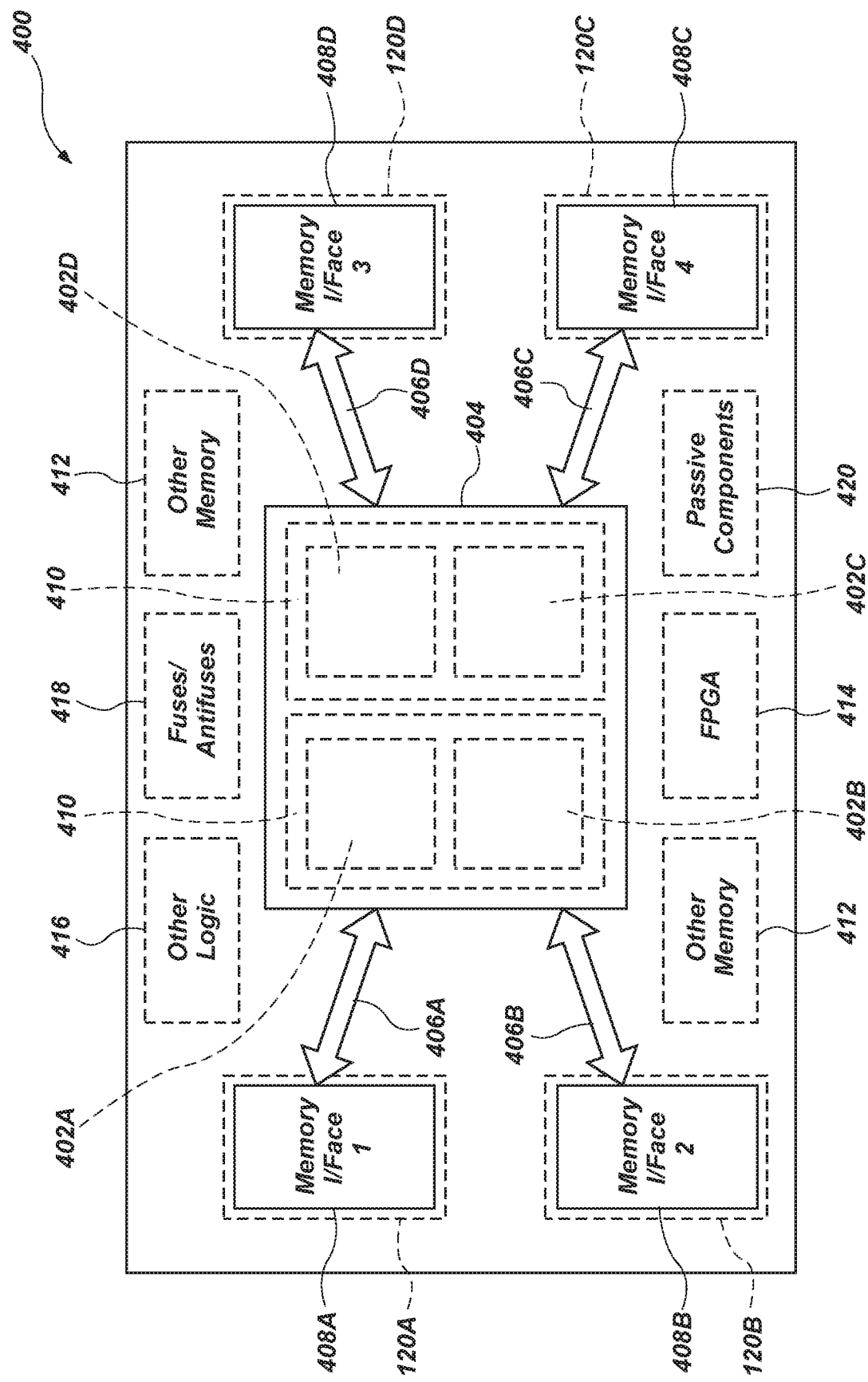
FIG. 4 is a block diagram of an embodiment of a microelectronic device assembly incorporating a stacked interposer structure in accordance with embodiments of the disclosure.

Referring now to FIG. 4, the figure depicts a block diagram representation of an example configuration for a stacked interposer structure 400, including example optional circuit componentry may be formed in accordance with the description herein. Stacked interposer structure 400 is analogous to interposers 106A and 106B of FIG. 1A, in that the upper surface of the upper interposer of the stack defines metallization configured to form processor interfaces 402A, 402B, 402C, 402D for four memory devices, as part of a processor interface operably coupled to SRAM 410 located under the footprint of processor 404 and additionally configured for external communication to other devices. Each processor interface 402A, 402B, 402C, 402D may communicate data, command, and control signals between the memory devices and the processor through cache memory in the form of SRAM 410 to and through a respective communication channel 406A, 406B, 406C, 406D extending to four memory interfaces 408A, 408B, 408C, 408D corresponding to interface circuitry segments 120A, 120B, 120C, 120D as described with respect to FIGS. 1A-1E. The particular configuration of metallization for each processor interface 402A, 402B, 402C, 402D, and also the contact array of each memory interface 408A, 408B, 408C, 408D can be adapted to a desired configuration, such as may be dictated by a standardized interface.

The ability to configure an interposer to include active and/or passive circuit components facilitates the forming of logic structures such as interface circuitry segments 120A-120D and/or additional structures, for example cache memory in the form of SRAM 410, within the interposer to simplify incorporating such circuit components into the microelectronic device assembly to be formed with interposers of the stacked interposer structure 400. In addition to cache memory, such as SRAM 410, another form of memory 412 may be formed within or over core 202, such as, by way of example only, any of DRAM, ferroelectric random-access memory (FeRAM), phase change memory (PCM), 3D XPoint™ memory, NAND flash memory, NOR flash memory, resistive random-access memory (ReRAM or RRAM), or other memory types known to persons skilled in the art, and/or a combination thereof.

Additionally, logic structures in addition to those of interface circuitry segments 120A-120D may be formed in interposers of the stacked interposer structure 400. Such logic structures may be in the form of Field-Programmable Gate Arrays (FPGAs) 414, or other types of logic 416. Additionally, configuration circuitry, as may be used to tune or trim circuits or to enable or disable circuit components, such as fuses or anti-fuses, can be formed in interposers of stacked interposer structure 400. And, as discussed previously passive circuit components 420, such as, for example components to condition signals traversing interposers of stacked interposer structure 400 may also be formed.

For clarity of the block diagram representation, the different circuit components are depicted surrounding, but offset from, processor 404. However, the ability to incorporate such circuit components into interposers of stacked interposer structure 400 facilitates placing the circuit components in a desired location within stacked interposer structure 400, such as placement of cache memory in the form of 410 under the footprint of processor 404 and interface circuitry segments 120A-120D, as better illustrated in FIGS. 1B, 1C and 1D. Any of the above memory, logic, or configuration circuitry may communicate through connected TSVs to the opposite side of an upper interpose of stacked interposer structure 400 and, as applicable to a lower interposer thereof.

Accordingly, stacked interposer structure 400 depicts, in schematic form, the various features that may be incorporated into a combination of stacked interposers, for example stacked interposers 200D1 and D2 and stacked interposers 200D1' and 200D2', respectively. In each instance, the various circuit components shown on a single level in FIG. 4 may be distributed among the two cooperative redistribution structures 214 of each two-interposer stacked interposer structure 200S, 200S', and active and passive circuitry may be fabricated on one or both cores 202 of stacked interposer structure 200S, 200S', to operate in combination with the circuitry of the redistribution structures 214 and with TSVs 204 extending through the respective cores 202.

The incorporation of logic gates and memory into the structure of described interposers was previously identified. As was described, for many such structures, particularly those including active components, forming one or more bodies of the components in the silicon of the interposer core may be desirable, with one or more bodies of the components formed in materials formed over the core. An example manner of a structure incorporating such active components and related structures into the interposer core will be discussed in reference to FIG. 5.

Figure 5:
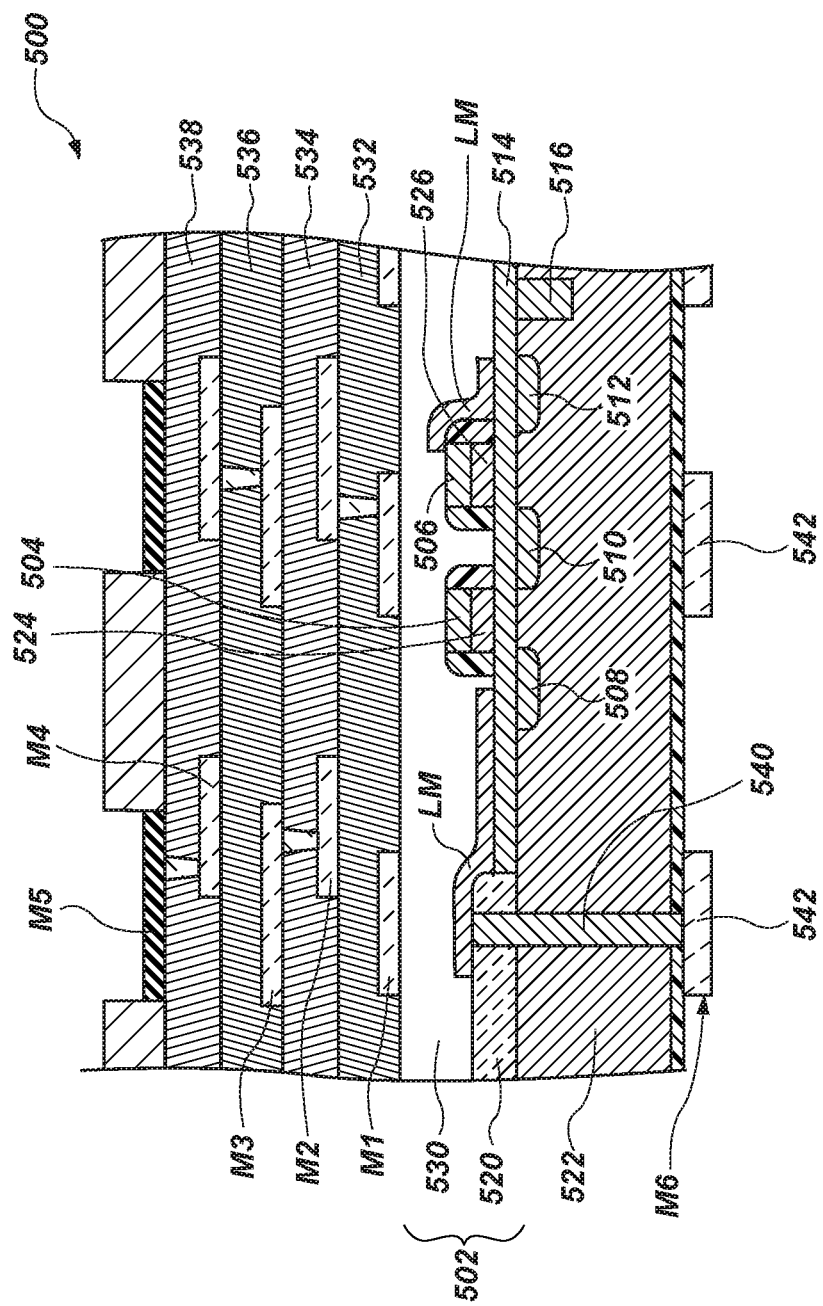
FIG. 5 is a simplified cross-sectional representation of an example section of an embodiment of an interposer having a semiconductor core and incorporating logic structures according to embodiments of the disclosure.

FIG. 5 depicts a portion of an example interposer 500 including circuit elements, including logic gates as previously discussed in reference to interposer 200 of FIG. 2. FIG. 5 depicts a logic structure 502 formed above silicon core 522. The levels of a redistribution structure comprising metal levels M2-M5 of RDL layers 532, 534, 536 and 538 have been enlarged for clarity, as has logic structure 502 and components thereof. In the depicted example, logic structure 502 includes coupled transistors 504, 506. Each transistor 504, 506 includes source/drain regions 508, 510, 512 formed by doping selected regions of silicon core 522. In some examples, in which such transistor gates are to be formed, it may be desirable to remove at least a portion of dielectric level 520 formed over silicon core 522, in order to form another dielectric material, indicated at 514, optimized to form a gate oxide for the transistors. In regions outside the logic gates, dielectric level 520 may remain intact. In some examples, it may be advantageous to isolate portions of silicon core 522 adjacent one or more circuit components, such as by forming shallow trench isolation, as indicated at 516 within silicon core 522. Forming of transistors 504, 506 can include forming one or more conductive gate materials 524, 526 (such as, for example, doped polysilicon) over the gate oxide 514; and isolating the sidewalls of the gates with spacers, as depicted. Also, as discussed previously, electrical connection between circuitry can be made with one or more conductive levels, such as one or more logic metal (LM) materials within the logic region. In order to provide a planar surface on which to form the previously-described RDLs, where, as in the example, the circuit components extend above the surface of silicon core 522, an insulating material 530, for example such as TEOS, may be formed above the logic circuitry and planarized. On the opposing side of core 522; conductive pads 542 are connected to the above-described circuitry through TSVs 540.

Figure 6:
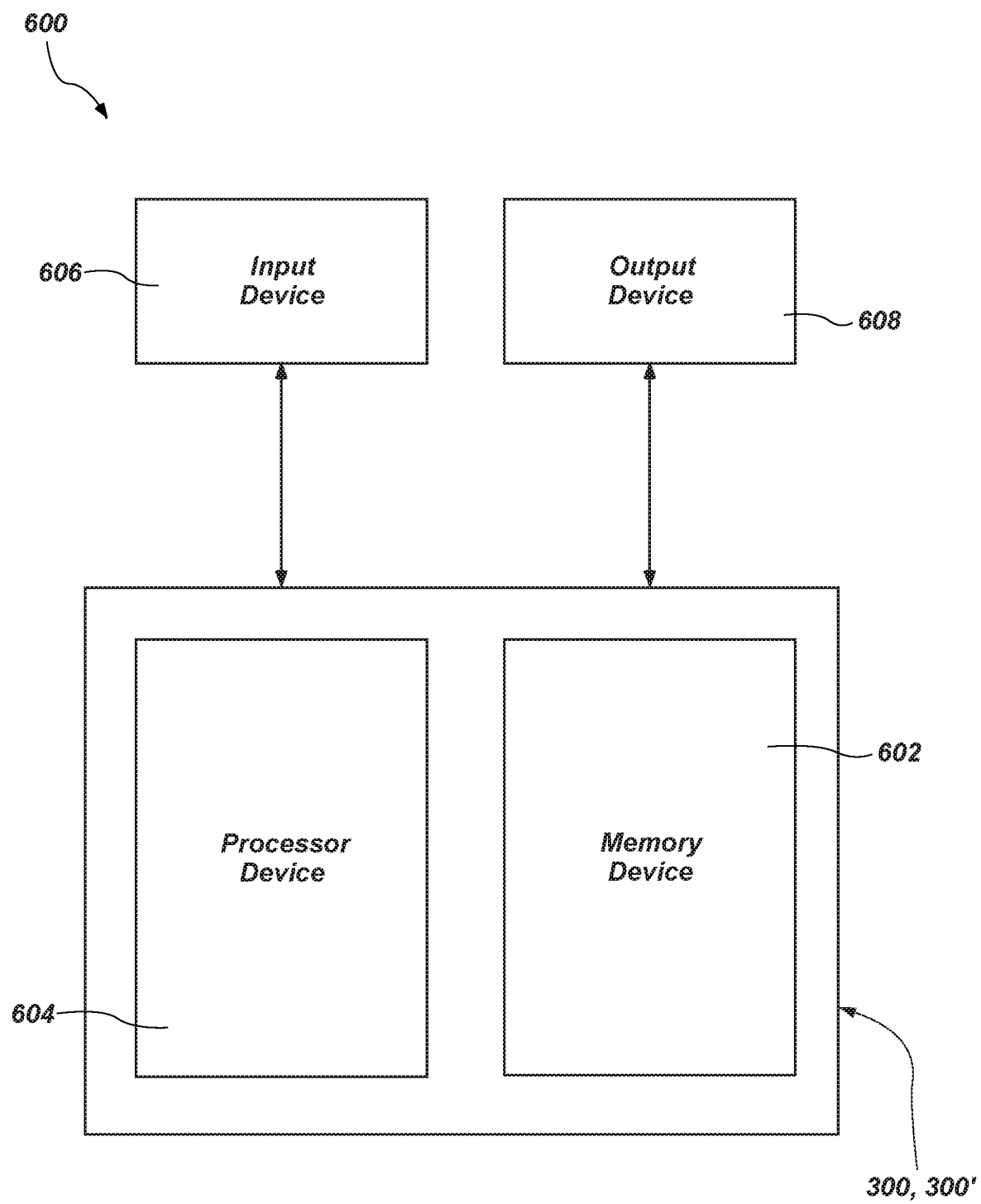
FIG. 6 is a block diagram of an electronic system incorporating a microelectronic device assembly according to embodiments of the disclosure.

The microelectronic device assemblies 300, 300' incorporating stacked interposer structures according to embodiments of the disclosure may be used in embodiments of electronic systems of the disclosure. For example, FIG. 6 is a block diagram of an illustrative electronic system 600 according to embodiments of disclosure. The electronic system 600 includes at least one electronic device fabricated in accordance with embodiments of the disclosure. The electronic device may comprise, for example, a memory device 602 comprising an embodiment of one or more of the microelectronic device assemblies 300, 300' previously described herein, such as an HBM assembly comprising a stack of DRAM dice. The electronic system 600 may further include a host device in the form of a processor device 604 such as, for example, a GPU, a CPU, a controller, an FPGA or a SoC incorporated in the microelectronic device assembly 300, 300'. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touchscreen device that can be used both to input information to the electronic system 600 and to output visual information to a user. The input device 606 and the output device 608 may communicate electrically with one or both of the processor device 604 and the memory device 602 in microelectronic device assembly 300, 300'.

Electronic system 600 may be a computer, a server, a laptop computer, a notebook computer, a Wi-Fi or cellular-enabled tablet computer such as an iPad® or SURFACE® tablet, a mobile phone, a wearable electronic device, a personal electronic device, a digital camera, a portable media (e.g., music, video) player, a navigation device, or the like. Similarly, electronic system 600 may be a portion or subcomponent of such a device. In some examples, electronic system 600 is an aspect of a computer with high reliability, mission critical, or low latency constraints or parameters, such as a vehicle (e.g., an autonomous automobile, airplane, a spacecraft, or the like). Electronic system 600 may be or include logic for artificial intelligence (AI), augmented reality (AR), or virtual reality (VR) applications.

In embodiments, a stacked interposer structure comprises a first interposer comprising a first core comprising a semiconductor material a first redistribution structure comprising multiple redistribution layers (RDLs) over a side of the first core and a first set of through silicon vias (TSVs) extending from the first redistribution structure through the first core to an opposite side of the first core and a second interposer comprising a second core comprising a semiconductor material a second redistribution structure comprising multiple redistribution layers (RDLs) over a side of the second core a second set of through silicon vias (TSVs) extending from the second redistribution structure through the second core to an opposite side of the second core. The first and second redistribution structures are operably coupled through at least one of the first set of TSVs and the second set of TSVs.

In embodiments, a microelectronic device assembly comprises a stacked interposer structure comprising multiple interconnected interposers, each interposer having a semiconductor core and a redistribution structure on one side thereof, at least one host device and at least one memory device mounted on, and operably coupled to, a redistribution structure of one of the multiple interconnected interposers, and circuitry of the stacked interposer structure operably coupling the at least one host device and the at least one memory device and extending to a side of the stacked interposer structure opposite the at least one host device and the at least one memory device for connection to higher level packaging.

In embodiments, an interposer comprises a silicon core comprising at least one of active circuitry and passive circuitry over a single active surface of the silicon core, a redistribution structure comprising at least four redistribution layers (RDLs) located over the active circuitry and the passive circuitry, and through silicon vias (TSVs) operably coupled to at least the redistribution structure and extending through the silicon core to a side thereof opposite the redistributions structure.

In embodiments, a stacked interposer structure comprises two interposers, one stacked above another and each having a redistribution structure comprising multiple redistribution layers (RDLs), the redistribution structures operably coupled through TSVs extending through a semiconductor core of at least one of the two interposers, the redistribution structure of one of the two interposers configured for operably coupling to a host device and a memory device and the redistribution structure of each of the two interposers comprising different conductive paths configured as operably coupled, in combination, to cooperatively function as a single redistribution structure comprising the combined number of multiple redistribution layers of the two interposers.

In embodiments, an electronic system comprises an input device, an output device, the electronic system further comprising a processor device and at least one memory device operably coupled to a redistribution structure of an interposer comprising a semiconductor core, the redistribution structure of the interposer operably coupled to another redistribution structure of another interposer at least by through silicon vias (TSVs) extending from the redistribution structure of the interposer through the semiconductor core to a side thereof opposite the redistribution structure, the input device and the output device operably coupled to the processor through conductive paths of the another interposer.

In embodiments, a method comprises providing two interposers each having a redistribution structure comprising multiple redistribution layers (RDLs) over a semiconductor core, conductive paths of the multiple redistribution layers (RDLs) of the redistribution structures cooperatively configured to function as a single redistribution structure consisting of a total number of redistribution layers (RDLs) of the two interposers, and electrically connecting the conductive paths of the redistribution layers (RDLs) of the two interposers through TSVs extending through at least one of the semiconductor cores.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A stacked interposer structure, consisting of:
    a first interposer comprising:
        a first core comprising a semiconductor material;
        a first redistribution structure comprising multiple redistribution layers (RDLs) over a side of the first core, the first redistribution structure configured for operably coupling, on a surface of the first redistribution structure, to one or more memory device stack locations and to a processor device location;
        cache memory at least partially within the core adjacent the first redistribution structure under and operably coupled through the first redistribution structure to the processor device location; and
        a first set of through silicon vias (TSVs) extending from the first redistribution structure through the first core to an opposite side of the first core; and
    a second interposer comprising:
        a second core comprising a semiconductor material;
        a second redistribution structure comprising multiple redistribution layers (RDLs) over a side of the second core and facing in a direction opposite a direction of the first redistribution structure;
        a second set of through silicon vias (TSVs) extending from the second redistribution structure through the second core to an opposite side of the second core; and
    the first and second redistribution structures being operably coupled through both the first set of TSVs and the second set of TSVs.

2. The stacked interposer structure of claim 1, wherein the first redistribution structure and the second redistribution structure are cooperatively configured to, in combination, mutually operably couple the one or more memory device stack locations and the processor location and operably couple the one or more memory device stack locations to higher-level packaging through the second interposer.

3. The stacked interposer structure of claim 1, wherein the second interposer is configured, on a surface thereof facing away from the first interposer, with conductive elements for operably coupling the stacked interposer structure to higher-level packaging.

4. The stacked interposer structure of claim 1, wherein TSVs of the first interposer and TSVs of the second interposer are mutually aligned and operably coupled with discrete conductive elements.

5. The stacked interposer structure of claim 1, wherein at least one of the first interposer and the second interposer comprises passive circuitry comprising at least one of capacitors, resistors or inductors over a core thereof, within the core thereof, or both.

6. The stacked interposer structure of claim 1, wherein at least one of the first interposer and the second interposer comprises active circuitry comprising at least one of memory other than cache memory, logic, fuses, antifuses or a field programmable gate array.

7. The stacked interposer structure of claim 1, wherein the first redistribution structure and the second redistribution structure comprise a same number of RDLs.

8. A microelectronic device assembly, comprising:
    a stacked interposer structure consisting of two directly interconnected, superimposed interposers, each interposer having a semiconductor core and a redistribution structure on one side thereof;
    at least one host device and at least one memory device mounted on, and operably coupled to, a redistribution structure of one of the two interconnected interposers, the at least one host device operably coupled to cache memory at least partially within the semiconductor core of the one interposer under a location of the at least one host device through the redistribution structure of the one interposer; and
    circuitry of the stacked interposer structure operably coupling the at least one host device and the at least one memory device and extending to a side of the stacked interposer structure opposite the at least one host device and the at least one memory device for connection to higher level packaging.

9. The microelectronic device assembly of claim 8, wherein the at least one host device comprises a graphics processor unit (GPU), a central processing unit (CPU), a controller, or a system on a chip (SoC), and the at least one memory device comprises at least one of DRAM, SRAM, ferroelectric RAM (FeRAM), Resistive RAM (RRAM or ReRAM), phase change memory (PCM), 3D XPoint™ memory, NAND flash memory, or NOR flash memory.

10. The microelectronic device assembly of claim 8, wherein the at least one host device comprises a graphics processor unit (GPU) and the at least one memory device comprises a high bandwidth memory device configured as a stack of high bandwidth DRAM die.

11. The microelectronic device assembly of claim 10, wherein a core of one of the multiple interconnected interposers of the stacked interposer structure comprises logic circuitry for interfacing with the high bandwidth memory device.

12. The microelectronic device assembly of claim 8, wherein the two interconnected interposers are interconnected by TSVs extending through the semiconductor core of at least one of the two interconnected interposers.

13. The microelectronic device assembly of claim 8, wherein at least one of the multiple interconnected interposers comprises at least one of passive circuitry and active circuitry other than cache memory on a semiconductor core thereof.

14. The microelectronic device assembly of claim 13, wherein the passive circuitry comprises at least one of capacitors, resistors or inductors, and the active circuitry comprises at least one of memory other than cache memory, logic, fuses, antifuses or a field programmable gate array.

15. The microelectronic device assembly of claim 8, wherein the redistribution structure of each of the multiple interconnected interposers comprises multiple redistribution layers (RDLs).

16. The microelectronic device assembly of claim 15, wherein each redistribution structure comprises a same number of redistribution layers (RDLs).

17. An electronic system, comprising:
an input device and an output device, the electronic system further comprising:
a processor device and at least one memory device operably coupled to a redistribution structure of an interposer comprising a semiconductor core including cache memory circuitry located under the processor device and operably coupled thereto through the redistribution structure of the interposer, the redistribution structure of the interposer operably coupled to another redistribution structure of another interposer at least by through silicon vias (TSVs) extending from the redistribution structure of the interposer through the semiconductor core to a side thereof opposite the redistribution structure; and
the input device and the output device operably coupled to the processor through conductive paths of the another interposer.

18. The electronic system of claim 17, wherein the at least one memory device comprises at least one stack of multiple high bandwidth memory die.

* * * * *

UNITED STATES PATENT AND TRADEMARK OFFICE
CERTIFICATE OF CORRECTION

PATENT NO. : 11,444,067 B2
APPLICATION NO. : 16/715242
DATED : September 13, 2022
INVENTOR(S) : Owen R. Fay and Chan H. Yoo It is certified that error appears in the above-identified patent and that said Letters Patent is hereby corrected as shown below:

In the Specification

| Column 2,  | Line 47, | change "US" to --L/S-- |
| Column 6,  | Line 64, | change "SOT" to --SOI-- |
| Column 8,  | Line 2,  | change "HT3M" to --HBM-- |
| Column 8,  | Line 3,  | change "RBM" to --HBM-- |
| Column 9,  | Line 53, | change "1069" to --106B-- |
| Column 12, | Line 7,  | change "to in" to --term-- |
| Column 13, | Line 48, | change "I D" to --1D-- |
| Column 19, | Line 57, | change "522;" to --522,-- |

Signed and Sealed this
Tenth Day of January, 2023

Katherine Kelly Vidal
*Director of the United States Patent and Trademark Office*